United States Patent
Hamada

(10) Patent No.: US 8,460,476 B2
(45) Date of Patent: Jun. 11, 2013

(54) APPARATUS FOR AND METHOD OF PROCESSING SUBSTRATE SUBJECTED TO EXPOSURE PROCESS

(75) Inventor: Tetsuya Hamada, Kyoto (JP)

(73) Assignee: Sokudo Co., Ltd, Kyoto (JP)

( * ) Notice: Subject to any disclaimer, the term of this patent is extended or adjusted under 35 U.S.C. 154(b) by 63 days.

(21) Appl. No.: 12/698,888

(22) Filed: Feb. 2, 2010

(65) Prior Publication Data

US 2010/0126527 A1 May 27, 2010

Related U.S. Application Data

(62) Division of application No. 11/464,636, filed on Aug. 15, 2006.

(30) Foreign Application Priority Data

Sep. 14, 2005 (JP) .................................. 2005-266888

(51) Int. Cl.
B08B 7/04 (2006.01)
(52) U.S. Cl.
USPC ........................................... 134/18; 134/25.1
(58) Field of Classification Search
USPC .................. 134/28, 2, 3, 26, 30, 33, 41, 95.2, 134/95.3, 102.1, 153, 902, 18, 25.4, 57, 56 R; 430/30; 355/53
See application file for complete search history.

(56) References Cited

U.S. PATENT DOCUMENTS

| | | | |
|---|---|---|---|
| 5,997,653 A | 12/1999 | Yamasaka | |
| 6,394,110 B2 | 5/2002 | Kamikawa et al. | |
| 2001/0012971 A1* | 8/2001 | Nguyen | 700/121 |
| 2002/0025651 A1* | 2/2002 | Takasawa et al. | 438/398 |

(Continued)

FOREIGN PATENT DOCUMENTS

| JP | 2004-342654 A | 9/1936 |
|---|---|---|
| JP | 2002-043208 A | 8/1939 |

(Continued)

OTHER PUBLICATIONS

Examination Report of Korean Application No. 10-2006-0088670, dated Aug. 31, 2007, (English Translation included), 9 pages total.
Examination Report of Japanese Patent Application No. 2005-266888, dated Jan. 15, 2010, (English Translation included), 3 pages total.
Search Report of Taiwanese Patent Application No. 095129430, mailed Nov. 19, 2010, 2 pages total. [English Translation Included].

(Continued)

*Primary Examiner* — Michael Kornakov
*Assistant Examiner* — Katelyn Whatley
(74) *Attorney, Agent, or Firm* — Kilpatrick Townsend & Stockton LLP

(57) ABSTRACT

A method of processing a substrate subjected to an exposure process includes the steps of: transporting a substrate subjected to the exposure process to a cleaning processing part and performing a cleaning process in said cleaning processing part on said substrate subjected to the exposure process. The method also includes the steps of transporting said substrate subjected to the cleaning process from said cleaning processing part to a heating processing part and performing a heating process in said heating processing part on said substrate subjected to the cleaning process. A first interprocess time interval between the instant at which the exposure process of a substrate is completed and the instant at which the heating process of the substrate is started is made approximately constant, and a second interprocess time interval between the instant at which the cleaning process of the substrate is completed and the instant at which the heating process of the substrate is started is made approximately constant.

6 Claims, 11 Drawing Sheets

U.S. PATENT DOCUMENTS

| | | |
|---|---|---|
| 2005/0077182 A1* | 4/2005 | Balisky et al. ............... 205/82 |
| 2005/0225735 A1 | 10/2005 | Magome et al. |
| 2005/0287821 A1 | 12/2005 | Higashi et al. |
| 2006/0154183 A1 | 7/2006 | Magome et al. |
| 2006/0234508 A1 | 10/2006 | Shirakashi et al. |
| 2007/0058147 A1 | 3/2007 | Hamada |
| 2007/0171391 A1 | 7/2007 | Magome et al. |

FOREIGN PATENT DOCUMENTS

| | | | |
|---|---|---|---|
| JP | 2001-005189 A | | 1/2001 |
| JP | 2003-007587 | | 1/2003 |
| JP | 2004-193597 | | 7/2004 |
| JP | 2004193597 A | * | 7/2004 |
| JP | 2005-0004156 | | 1/2005 |
| JP | 2005-101487 | | 4/2005 |
| JP | 2005101487 A | * | 4/2005 |
| JP | 2005-183709 | | 7/2005 |
| JP | 2005-197469 | | 7/2005 |
| JP | 2005-294520 | | 10/2005 |

OTHER PUBLICATIONS

Office Action of Japanese Patent Application No. 2005-266888, mailed Oct. 5, 2010, 4 pages total. [English Translation Included].

Office Action in the corresponding Taiwanese Application No. 095129430 dated Feb. 25, 2011, 10 pages.

Non-Final Office Action for U.S. Appl. No. 11/464,636 mailed Jun. 6, 2008, 8 pages.

Final Office Action for U.S. Appl. No. 11/464,636 mailed Nov. 24, 2008, 8 pages.

Non-Final Office Action for U.S. Appl. No. 11/464,636 mailed May 18, 2009, 6 pages.

Final Office Action for U.S. Appl. No. 11/464,636 mailed Nov. 9, 2009, 6 pages.

* cited by examiner

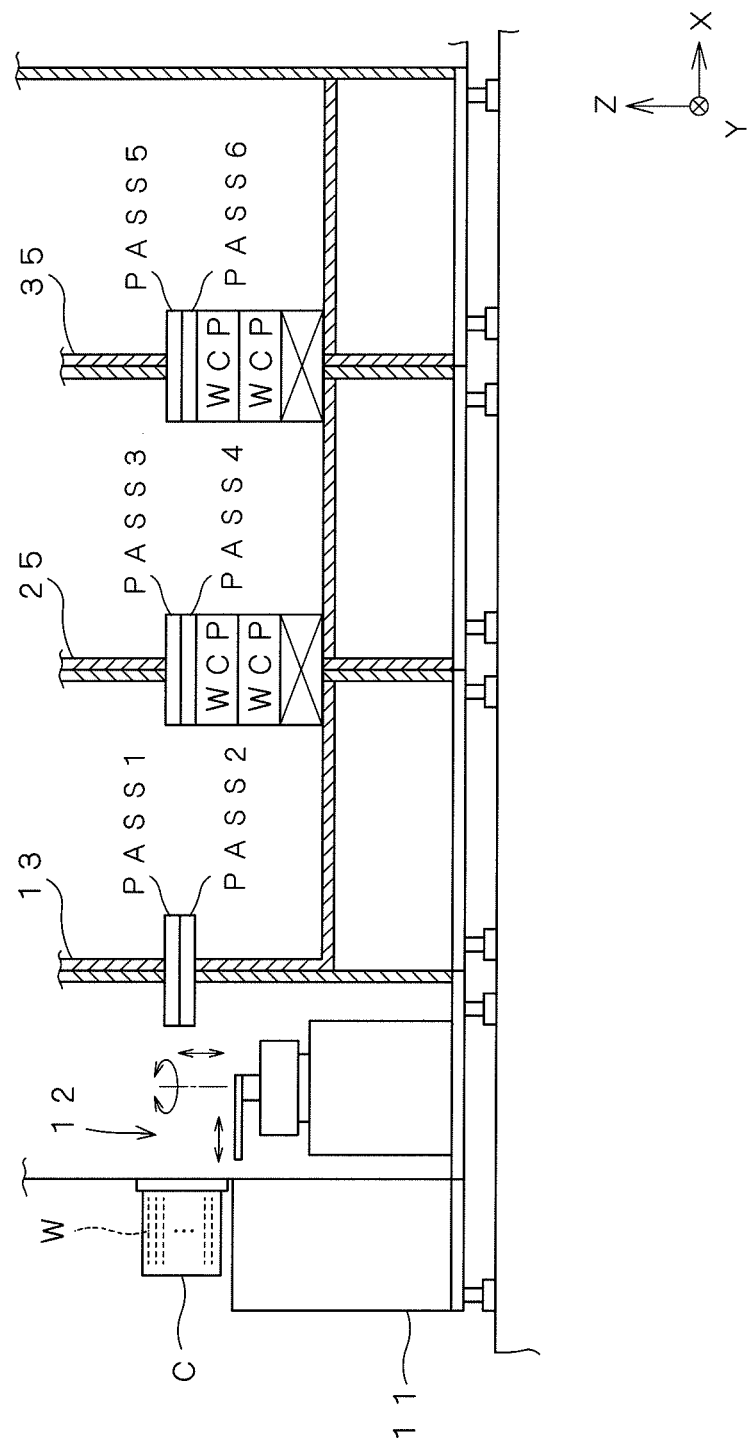

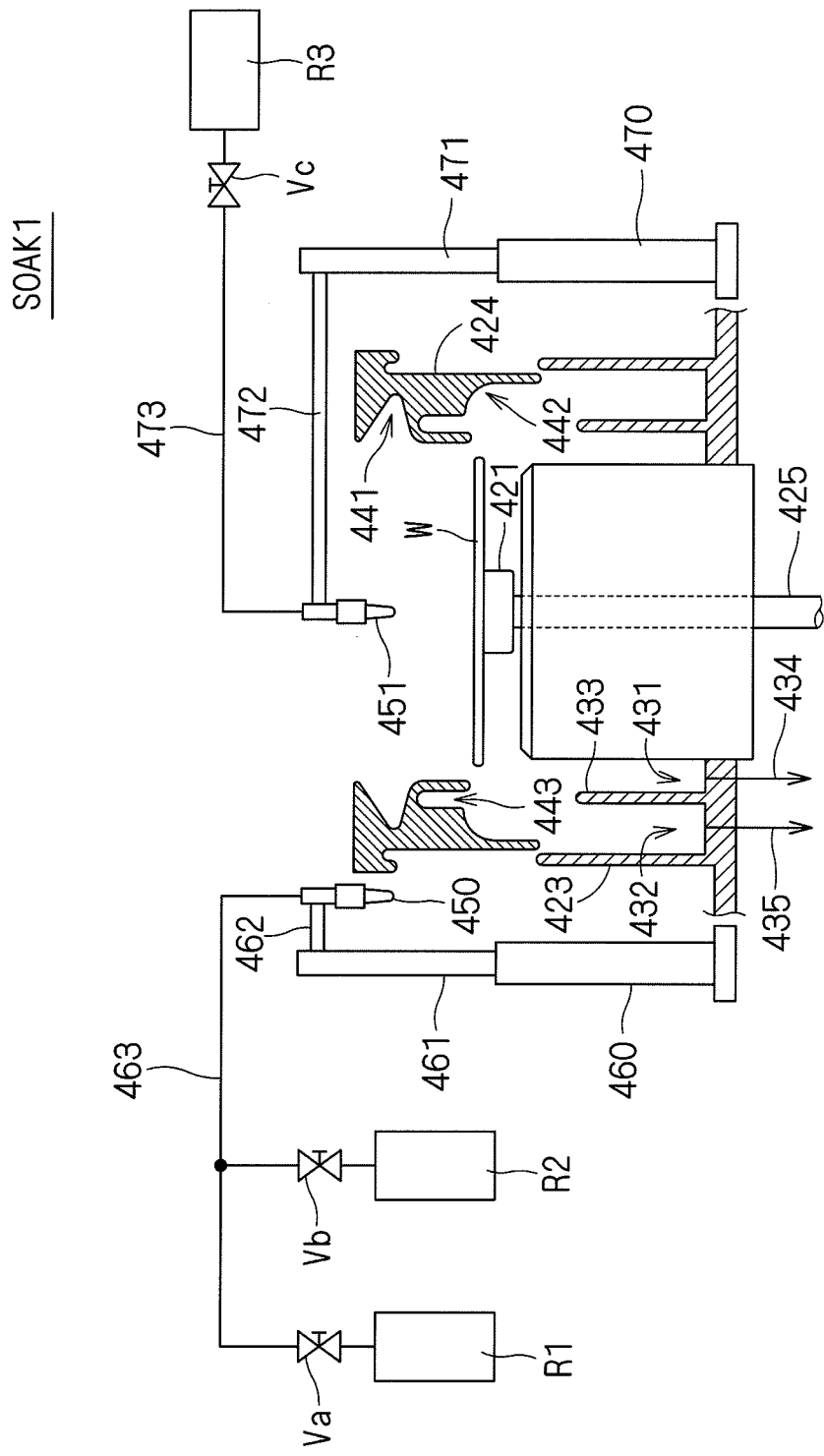

F I G. 7A
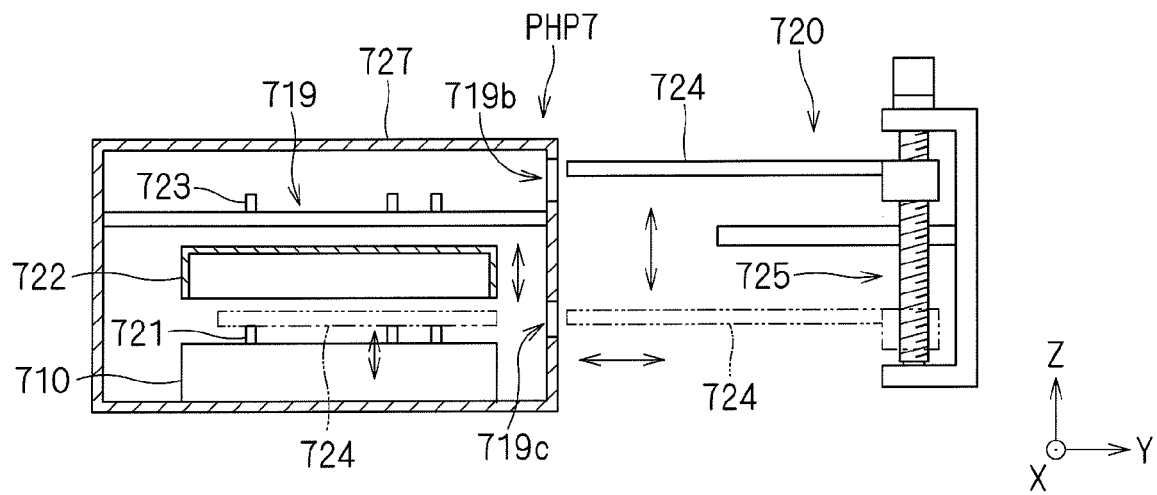
F I G. 7B
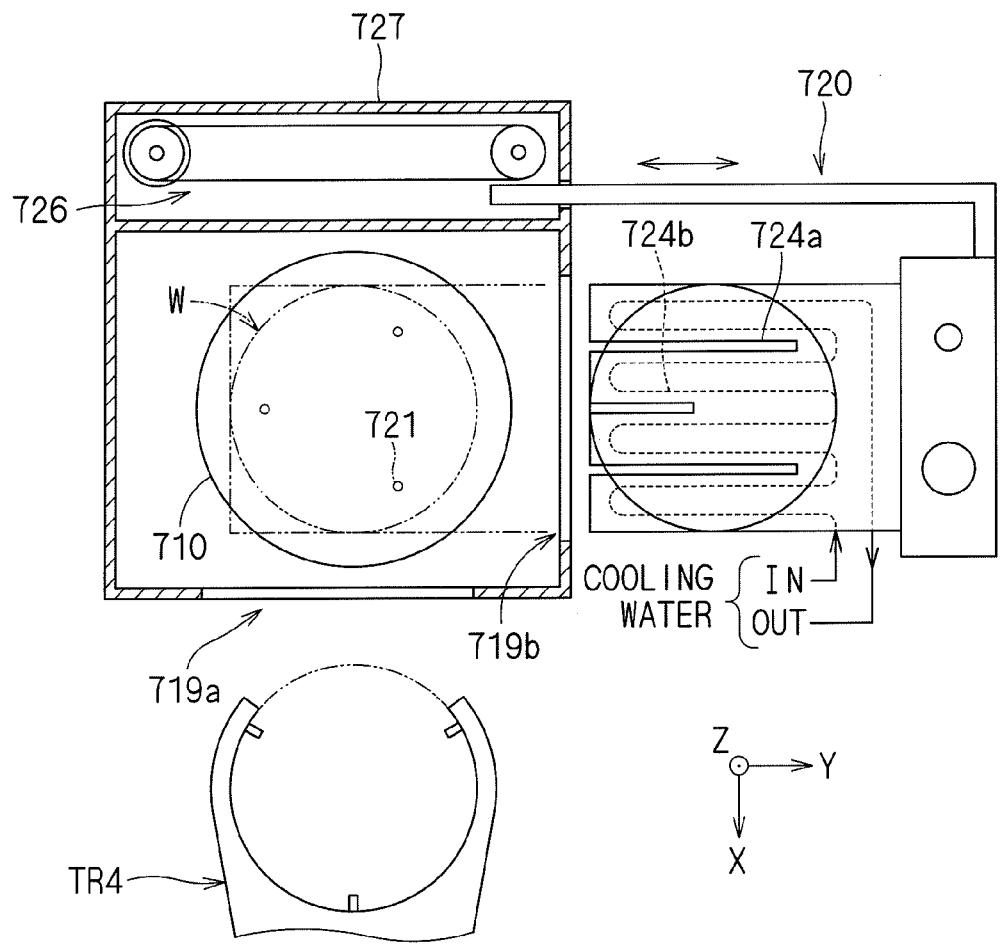

F I G . 8
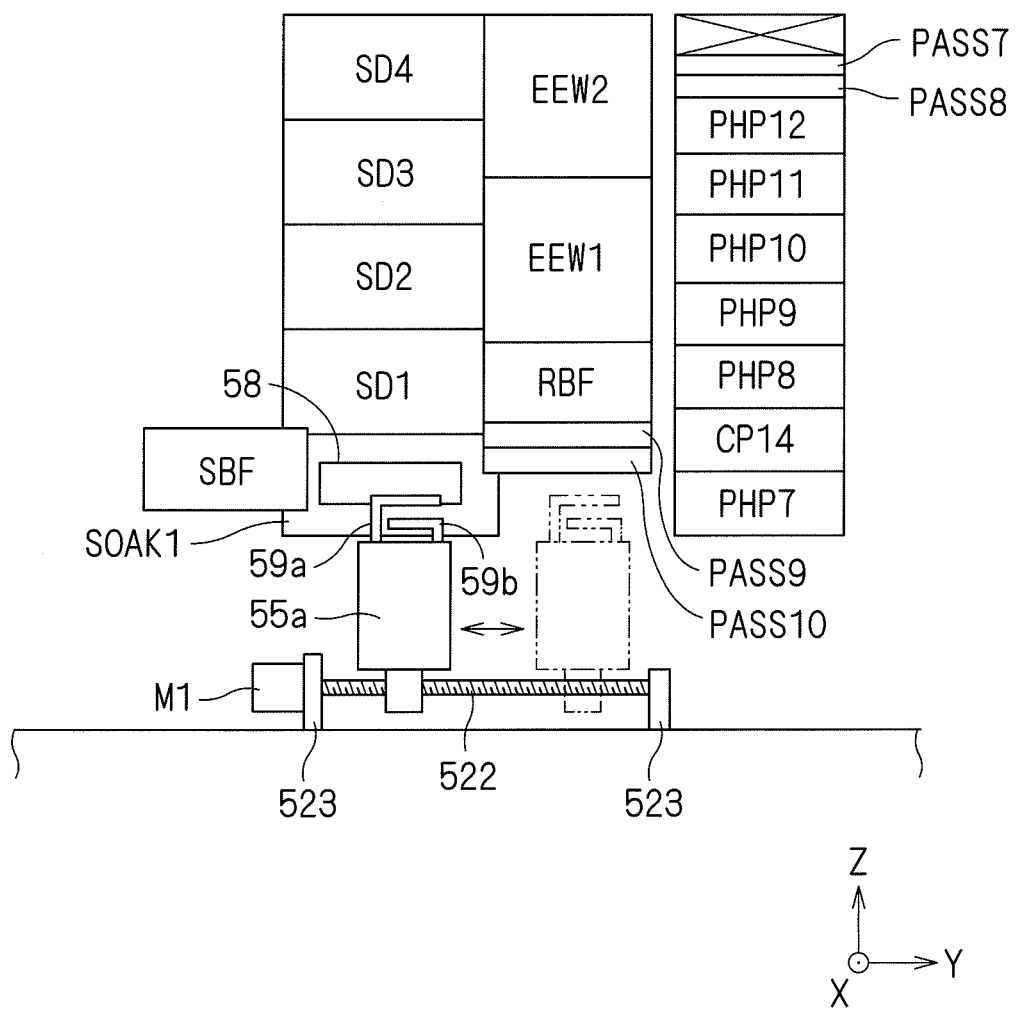

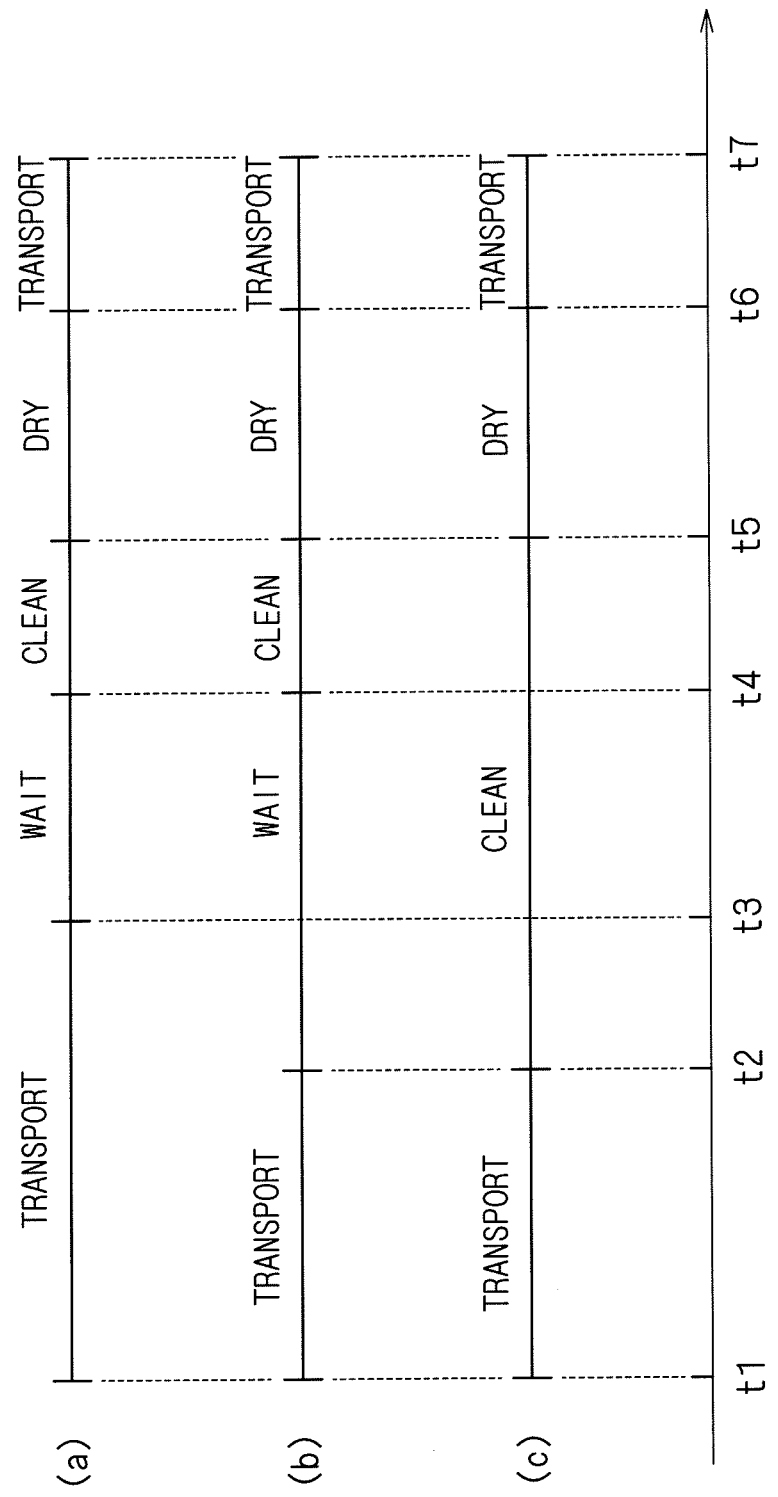

APPARATUS FOR AND METHOD OF PROCESSING SUBSTRATE SUBJECTED TO EXPOSURE PROCESS

CROSS-REFERENCES TO RELATED APPLICATIONS

This application is a division of U.S. patent application Ser. No. 11/464,636, filed Aug. 15, 2006, which claims priority to Japanese Patent Application No. 2005-266888, filed Sep. 14, 2005. The disclosures of Ser. No. 11/464,636 and JP 2005-266888 are hereby incorporated by reference in their entirety for all purposes.

BACKGROUND OF THE INVENTION

1. Field of the Invention

The present invention relates to a method of processing a substrate such as a semiconductor substrate subjected to an exposure process, a glass substrate for a liquid crystal display device, a glass substrate for a photomask, a substrate for an optical disk and the like, and a substrate processing apparatus for executing the method.

2. Description of the Background Art

As is well known, semiconductor and liquid crystal display products and the like are fabricated by performing a series of processes including cleaning, resist coating, exposure, development, etching, interlayer insulation film formation, heat treatment, dicing and the like on the above-mentioned substrate. An apparatus which performs a resist coating process on a substrate to transfer the substrate to an exposure unit and which receives an exposed substrate from the exposure unit to perform a development process on the exposed substrate, among the above-mentioned processes, is widely used as a so-called coater-and-developer.

The exposure unit (also known as a stepper) for performing an exposure process is typically connected to and provided in juxtaposition with the above-mentioned coater-and-developer, and prints a circuit pattern on a substrate formed with a resist film. With recent decrease in width of lines exposed to light, a lamp for use in printing of a pattern in such an exposure unit is shifting from a conventional ultraviolet light source toward a KrF excimer laser light source and also toward an ArF excimer laser light source. A chemically amplified resist is used when a pattern is printed using a KrF light source and an ArF light source. The chemically amplified resist is a photoresist of the type such that an acid formed by a photochemical reaction during the exposure process acts as a catalyst for resist reactions such as crosslinking, polymerization and the like in the subsequent heat treatment step to change the solubility of the resist in a developing solution, whereby pattern printing is completed.

When the chemically amplified resist is used, a slight variation in processing conditions exerts a large influence upon line width uniformity because an extremely small amount of acid catalyst is formed during the exposure process. In particular, it is known that the time interval between the instant of the end of the exposure process and the instant of the start of a post-exposure bake process exerts the greatest influence on the line width uniformity. Thus, a technique for controlling the time interval between the end of the exposure process and the start of the post-exposure bake process to be constant is proposed, for example, in Japanese Patent Application Laid-Open No. 2002-43208 and Japanese Patent Application Laid-Open No. 2004-342654. Such a technique can improve the line width uniformity when the chemically amplified resist is used.

Unfortunately, some variations in line width still occur even if the time interval between the end of the exposure process and the start of the post-exposure bake process is made constant. In particular, a substrate subjected to an immersion exposure process is subjected to a deionized water cleaning process in the coater-and-developer. In such a case, it is contemplated that the time interval between the instant at which the deionized water cleaning process is completed and the instant at which the post-exposure bake process is executed is also important. However, no particular consideration has conventionally been given to controlling this time interval.

SUMMARY OF THE INVENTION

The present invention is intended for a substrate processing apparatus disposed adjacent to an exposure apparatus.

According to the present invention, the substrate processing apparatus comprises: a cleaning processing part for performing at least a cleaning process on a substrate subjected to an exposure process by the exposure apparatus; a heating processing part for performing a heating process on a substrate subjected to the cleaning process; a transport mechanism for receiving a substrate from the exposure apparatus to transport the substrate through the cleaning processing part to the heating processing part; and a controller for providing an approximately constant first interprocess time interval between the instant at which the exposure apparatus completes the exposure process of a substrate and the instant at which the heating processing part starts the heating process of the substrate, and for providing an approximately constant second interprocess time interval between the instant at which the cleaning processing part completes the cleaning process of the substrate and the instant at which the heating processing part starts the heating process of the substrate.

This provides a uniform processing history for the substrates, thereby further improving the line width uniformity of a pattern.

Preferably, the controller adjusts the instant at which the cleaning processing part completes the cleaning process to thereby provide the approximately constant first interprocess time interval and the approximately constant second interprocess time interval.

This provides a uniform processing history for the substrates easily with reliability.

The present invention is also intended for a method of processing a substrate subjected to an exposure process.

It is therefore an object of the present invention to provide an apparatus for and a method of processing a substrate which are capable of further improving the line width uniformity of a pattern.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a view showing a construction around substrate rest parts;

FIG. 6 is a view for illustrating a construction of a cleaning processing unit;

FIG. 7A is a side sectional view of a heating part with a temporary substrate rest part;

FIG. 7B is a plan view of the heating part with the temporary substrate rest part;

FIG. 8 is a side view of an interface block;

FIG. 11 is a timing chart for processing from the end of the exposure to the post-exposure bake process.

DETAILED DESCRIPTION OF THE PREFERRED EMBODIMENTS

Figure 1:
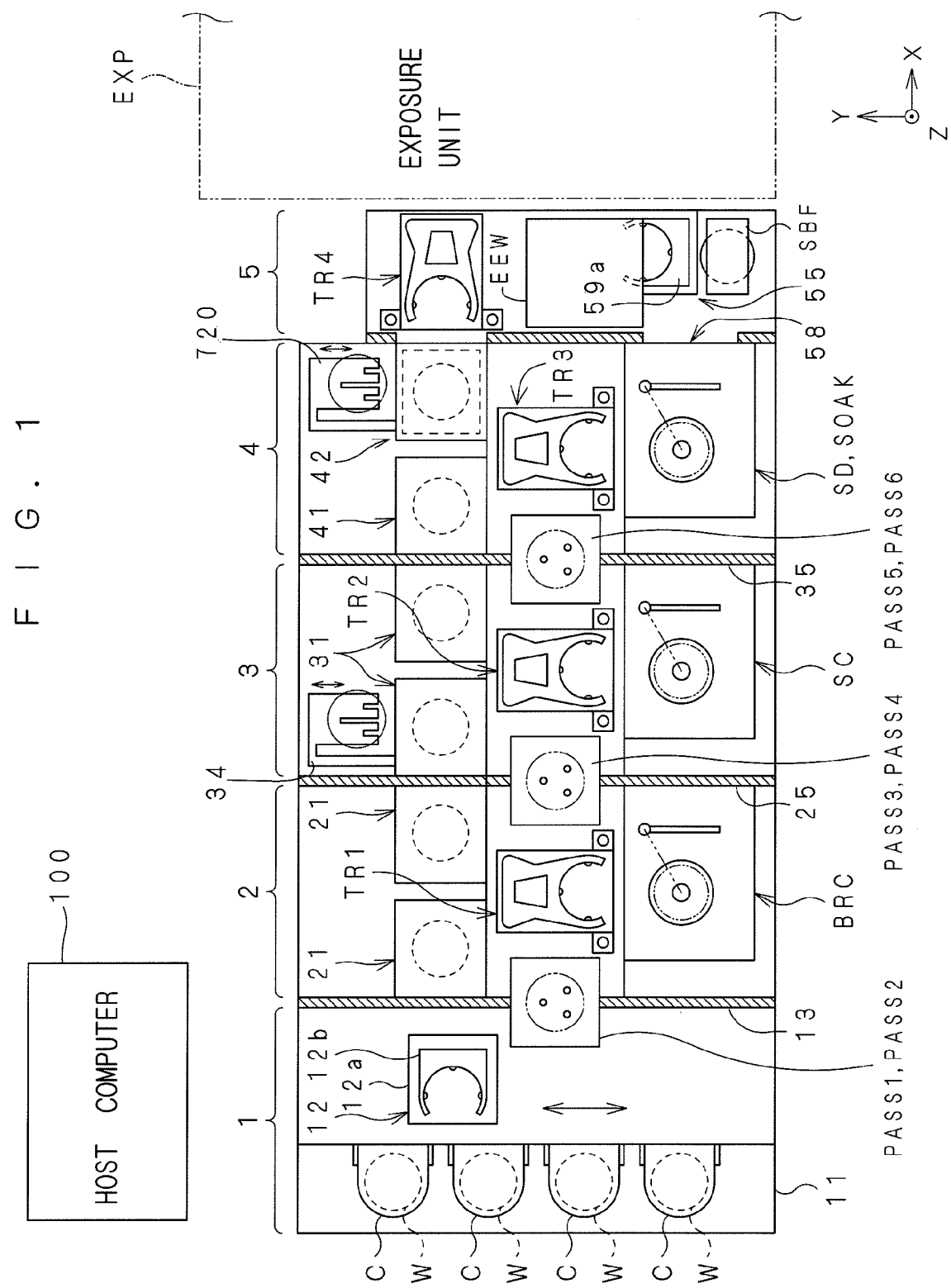
FIG. 1 is a plan view of a substrate processing apparatus according to the present invention.
Figure 2:
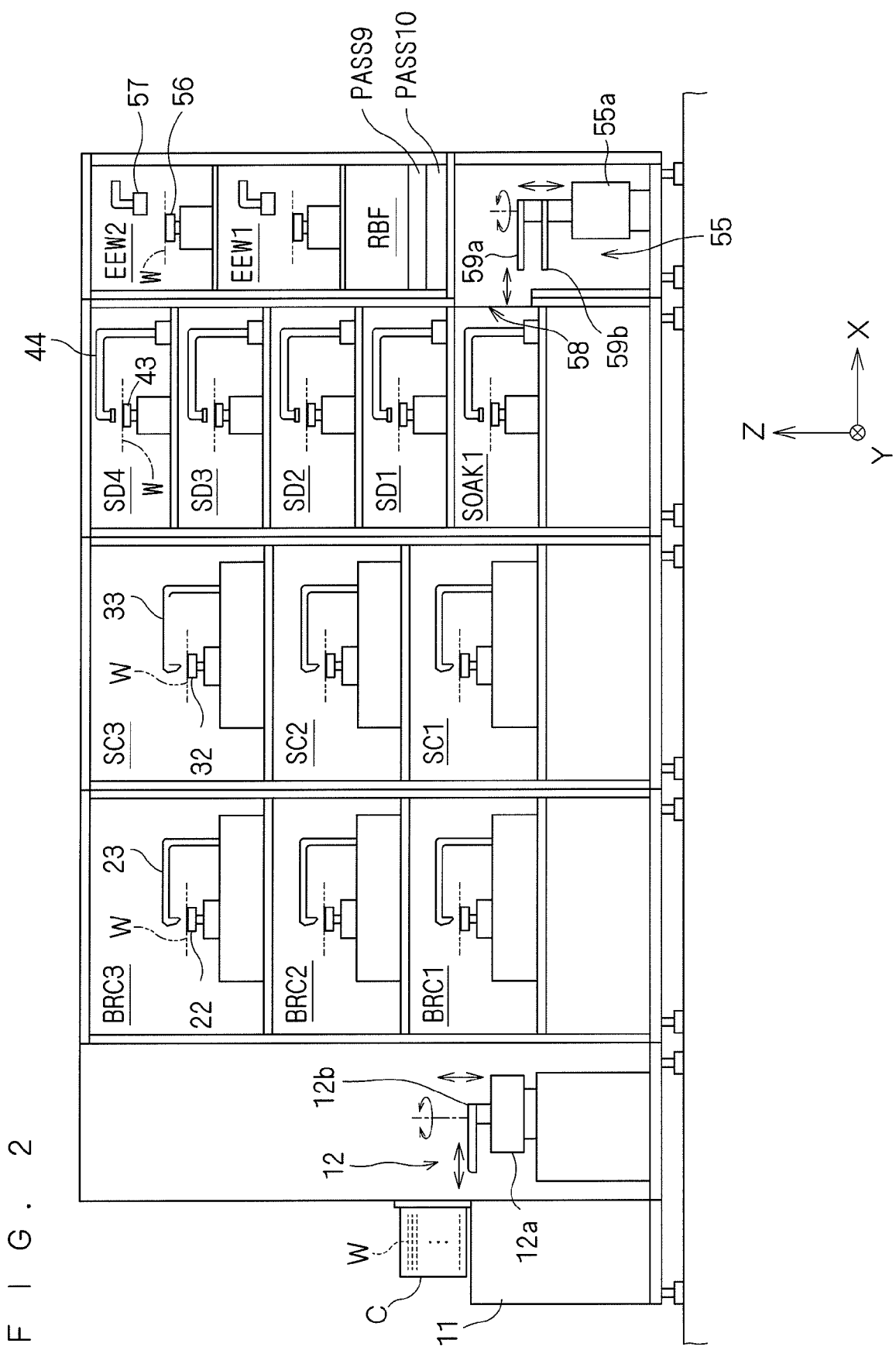
FIG. 2 is a front view of a liquid processing part.
Figure 3:
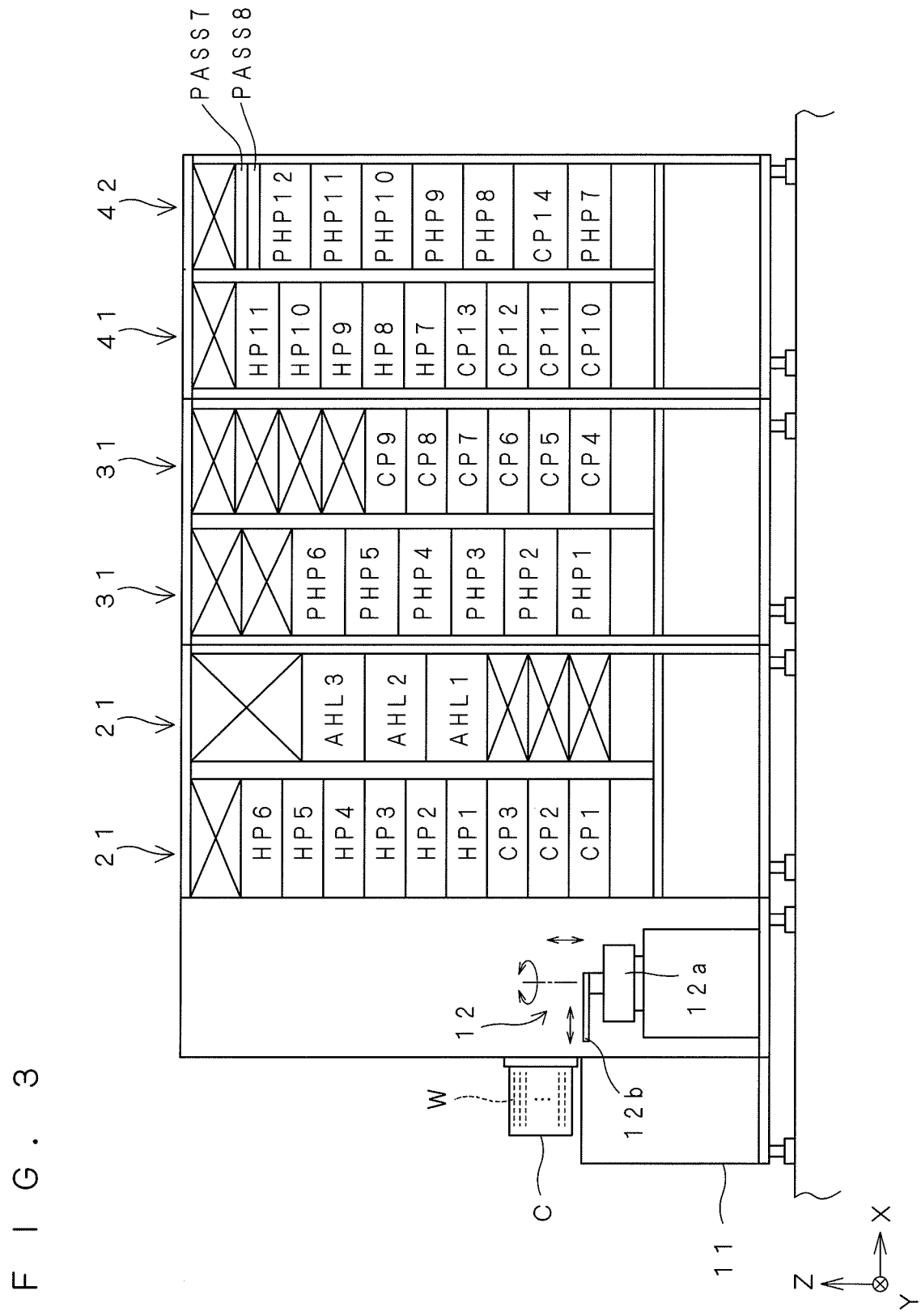
FIG. 3 is a front view of a thermal processing part.

A preferred embodiment according to the present invention will now be described in detail with reference to the drawings. FIG. 1 is a plan view of a substrate processing apparatus according to the present invention. FIG. 2 is a front view of a liquid processing part in the substrate processing apparatus. FIG. 3 is a front view of a thermal processing part in the substrate processing apparatus. FIG. 4 is a view showing a construction around substrate rest parts. An XYZ rectangular coordinate system in which an XY plane is defined as the horizontal plane and a Z axis is defined to extend in the vertical direction is additionally shown in FIG. 1 and the subsequent figures for purposes of clarifying the directional relationship therebetween.

The substrate processing apparatus according to the preferred embodiment is an apparatus (a so-called coater-and-developer) for forming an anti-reflective film and a photoresist film on substrates such as semiconductor wafers by coating and for performing a development process on substrates subjected to a pattern exposure process. The substrates to be processed by the substrate processing apparatus according to the present invention are not limited to semiconductor wafers, but may include glass substrates for a liquid crystal display device, and the like.

The substrate processing apparatus according to the preferred embodiment includes an indexer block 1, a BARC (Bottom Anti-Reflective Coating) block 2, a resist coating block 3, a development processing block 4, and an interface block 5. In the substrate processing apparatus, the five processing blocks 1 to 5 are arranged in side-by-side relation. An exposure unit (or stepper) EXP which is an external apparatus separate from the substrate processing apparatus according to the present invention is provided and connected to the interface block 5. That is, the substrate processing apparatus according to the preferred embodiment is disposed adjacent to the exposure unit EXP. The substrate processing apparatus according to the preferred embodiment and the exposure unit EXP are connected via LAN lines (not shown) to a host computer 100.

The indexer block 1 is a processing block for transferring unprocessed substrates received from the outside of the substrate processing apparatus outwardly to the BARC block 2 and the resist coating block 3, and for transporting processed substrates received from the development processing block 4 to the outside of the substrate processing apparatus. The indexer block 1 includes a table 11 for placing thereon a plurality of (in this preferred embodiment, four) cassettes (or carriers) C in juxtaposition, and a substrate transfer mechanism 12 for taking an unprocessed substrate W out of each of the cassettes C and for storing a processed substrate W into each of the cassettes C. The substrate transfer mechanism 12 includes a movable base 12a movable horizontally (in the Y direction) along the table 11, and a holding arm 12b mounted on the movable base 12a and for holding a substrate W in a horizontal position. The holding arm 12b is capable of moving upwardly and downwardly (in the Z direction) over the movable base 12a, pivoting within a horizontal plane and moving back and forth in the direction of the pivot radius. Thus, the substrate transfer mechanism 12 can cause the holding arm 12b to gain access to each of the cassettes C, thereby taking an unprocessed substrate W out of each cassette C and storing a processed substrate W into each cassette C. The cassettes C may be of the following types: an SMIF (standard mechanical interface) pod, and an OC (open cassette) which exposes stored substrates W to the atmosphere, in addition to a FOUP (front opening unified pod) which stores substrates W in an enclosed or sealed space.

The BARC block 2 is provided in adjacent relation to the indexer block 1. A partition 13 for closing off the communication of atmosphere is provided between the indexer block 1 and the BARC block 2. The partition 13 is provided with a pair of vertically arranged substrate rest parts PASS1 and PASS2 each for placing a substrate W thereon for the transfer of the substrate W between the indexer block 1 and the BARC block 2.

The upper substrate rest part PASS 1 is used for the transport of a substrate W from the indexer block 1 to the BARC block 2. The substrate rest part PASS 1 includes three support pins. The substrate transfer mechanism 12 of the indexer block 1 places an unprocessed substrate W taken out of one of the cassettes C onto the three support pins of the substrate rest part PASS1. A transport robot TR1 of the BARC block 2 to be described later receives the substrate W placed on the substrate rest part PASS1. The lower substrate rest part PASS2, on the other hand, is used for the transport of a substrate W from the BARC block 2 to the indexer block 1. The substrate rest part PASS2 also includes three support pins. The transport robot TR1 of the BARC block 2 places a processed substrate W onto the three support pins of the substrate rest part PASS2. The substrate transfer mechanism 12 receives the substrate W placed on the substrate rest part PASS2 and stores the substrate W into one of the cassettes C. Pairs of substrate rest parts PASS3 to PASS10 to be described later are similar in construction to the pair of substrate rest parts PASS1 and PASS2.

The substrate rest parts PASS1 and PASS2 extend through the partition 13. Each of the substrate rest parts PASS1 and PASS2 includes an optical sensor (not shown) for detecting the presence or absence of a substrate W thereon. Based on a detection signal from each of the sensors, a judgment is made as to whether or not the substrate transfer mechanism 12 and the transport robot TR1 of the BARC block 2 stand ready to transfer and receive a substrate W to and from the substrate rest parts PASS1 and PASS2.

Next, the BARC block 2 will be described. The BARC block 2 is a processing block for forming an anti-reflective film by coating at the bottom of a photoresist film (i.e., as an undercoating film for the photoresist film) to reduce standing waves or halation occurring during exposure. The BARC block 2 includes a bottom coating processor BRC for coating the surface of a substrate W with the anti-reflective film, a pair of thermal processing towers 21 for performing a thermal process which accompanies the formation of the anti-reflective film by coating, and the transport robot TR1 for transferring and receiving a substrate W to and from the bottom coating processor BRC and the pair of thermal processing towers 21.

In the BARC block 2, the bottom coating processor BRC and the pair of thermal processing towers 21 are arranged on opposite sides of the transport robot TR1. Specifically, the bottom coating processor BRC is on the front side of the substrate processing apparatus, and the pair of thermal processing towers 21 are on the rear side thereof. Additionally, a thermal barrier not shown is provided on the front side of the pair of thermal processing towers 21. Thus, the thermal effect of the pair of thermal processing towers 21 upon the bottom coating processor BRC is avoided by spacing the bottom coating processor BRC apart from the pair of thermal processing towers 21 and by providing the thermal barrier.

As shown in FIG. 2, the bottom coating processor BRC includes three coating processing units BRC1, BRC2 and BRC3 similar in construction to each other and arranged in stacked relation in bottom-to-top order. The three coating processing units BRC1, BRC2 and BRC3 are collectively referred to as the bottom coating processor BRC, unless otherwise identified. Each of the coating processing units BRC1, BRC2 and BRC3 includes a spin chuck 22 for rotating a substrate W in a substantially horizontal plane while holding the substrate W in a substantially horizontal position under suction, a coating nozzle 23 for applying a coating solution for the anti-reflective film onto the substrate W held on the spin chuck 22, a spin motor (not shown) for rotatably driving the spin chuck 22, a cup (not shown) surrounding the substrate W held on the spin chuck 22, and the like.

As shown in FIG. 3, one of the thermal processing towers 21 which is closer to the indexer block 1 includes six hot plates HP1 to HP6 for heating a substrate W up to a predetermined temperature, and cool plates CP1 to CP3 for cooling a heated substrate W down to a predetermined temperature and maintaining the substrate W at the predetermined temperature. The cool plates CP1 to CP3 and the hot plates HP1 to HP6 are arranged in stacked relation in bottom-to-top order in this thermal processing tower 21. The other of the thermal processing towers 21 which is farther from the indexer block 1 includes three adhesion promotion processing parts AHL1 to AHL3 arranged in stacked relation in bottom-to-top order for thermally processing a substrate W in a vapor atmosphere of HMDS (hexamethyl disilazane) to promote the adhesion of the resist film to the substrate W. The locations indicated by the cross marks (x) in FIG. 3 are occupied by a piping and wiring section or reserved as empty space for future addition of processing units.

Thus, stacking the coating processing units BRC1 to BRC3 and the thermal processing units (the hot plates HP1 to HP6, the cool plates CP1 to CP3, and the adhesion promotion processing parts AHL1 to AHL3 in the BARC block 2) in tiers provides smaller space occupied by the substrate processing apparatus to reduce the footprint thereof. The side-by-side arrangement of the pair of thermal processing towers 21 is advantageous in facilitating the maintenance of the thermal processing units and in eliminating the need for extension of ducting and power supply equipment necessary for the thermal processing units to a much higher position.

Figure 5A:
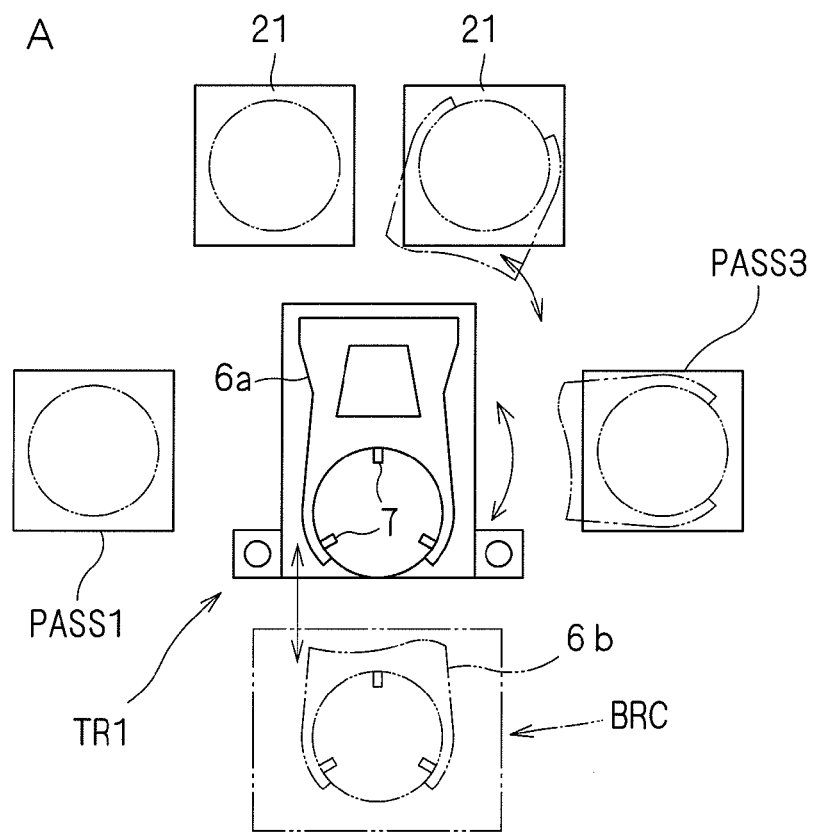
FIG. 5A is a plan view of a transport robot.
Figure 5B:
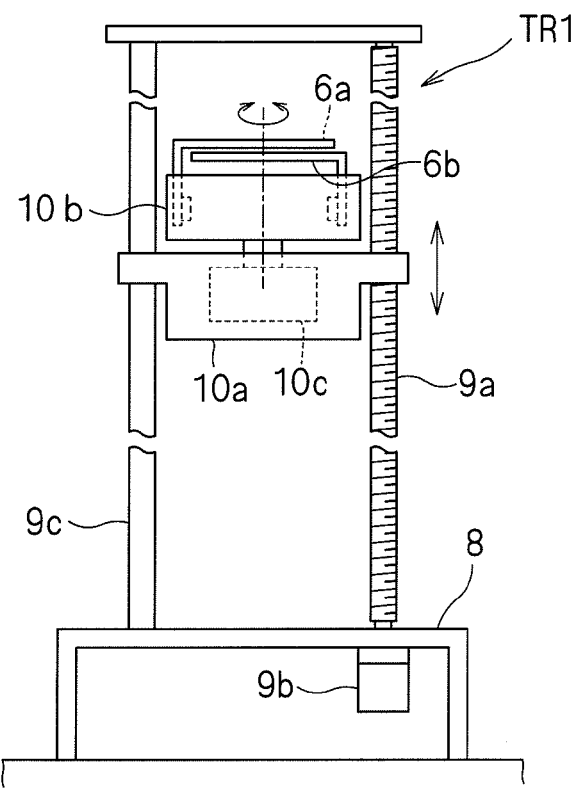
FIG. 5B is a front view of the transport robot.

FIGS. 5A and 5B are views for illustrating the transport robot TR1 provided in the BARC block 2. FIG. 5A is a plan view of the transport robot TR1, and FIG. 5B is a front view of the transport robot TR1. The transport robot TR1 includes a pair of (upper and lower) holding arms 6a and 6b in proximity to each other for holding a substrate W in a substantially horizontal position. Each of the holding arms 6a and 6b includes a distal end portion of a substantially C-shaped plan configuration, and a plurality of pins 7 projecting inwardly from the inside of the substantially C-shaped distal end portion for supporting the peripheral edge of a substrate W from below.

The transport robot TR1 further includes a base 8 fixedly mounted on an apparatus base (or an apparatus frame). A guide shaft 9c is mounted upright on the base 8, and a threaded shaft 9a is rotatably mounted and supported upright on the base 8. A motor 9b for rotatably driving the threaded shaft 9a is fixedly mounted to the base 8. A lift 10a is in threaded engagement with the threaded shaft 9a, and is freely slidable relative to the guide shaft 9c. With such an arrangement, the motor 9b rotatably drives the threaded shaft 9a, whereby the lift 10a is guided by the guide shaft 9c to move up and down in a vertical direction (in the Z direction).

An arm base 10b is mounted on the lift 10a pivotably about a vertical axis. The lift 10a contains a motor 10c for pivotably driving the arm base 10b. The pair of (upper and lower) holding arms 6a and 6b described above are provided on the arm base 10b. Each of the holding arms 6a and 6b is independently movable back and forth in a horizontal direction (in the direction of the pivot radius of the arm base 10b) by a sliding drive mechanism (not shown) mounted to the arm base 10b.

With such an arrangement, the transport robot TR1 is capable of causing each of the pair of holding arms 6a and 6b to independently gain access to the substrate rest parts PASS1 and PASS2, the thermal processing units provided in the thermal processing towers 21, the coating processing units provided in the bottom coating processor BRC, and the substrate rest parts PASS3 and PASS4 to be described later, thereby transferring and receiving substrates W to and from the above-mentioned parts and units, as shown in FIG. 5A.

Next, the resist coating block 3 will be described. The resist coating block 3 is provided so as to be sandwiched between the BARC block 2 and the development processing block 4. A partition 25 for closing off the communication of atmosphere is also provided between the resist coating block 3 and the BARC block 2. The partition 25 is provided with the pair of vertically arranged substrate rest parts PASS3 and PASS4 each for placing a substrate W thereon for the transfer of the substrate W between the BARC block 2 and the resist coating block 3. The substrate rest parts PASS3 and PASS4 are similar in construction to the above-mentioned substrate rest parts PASS1 and PASS2.

The upper substrate rest part PASS3 is used for the transport of a substrate W from the BARC block 2 to the resist coating block 3. Specifically, a transport robot TR2 of the resist coating block 3 receives the substrate W placed on the substrate rest part PASS3 by the transport robot TR1 of the BARC block 2. The lower substrate rest part PASS4, on the other hand, is used for the transport of a substrate W from the resist coating block 3 to the BARC block 2. Specifically, the transport robot TR1 of the BARC block 2 receives the substrate W placed on the substrate rest part PASS4 by the transport robot TR2 of the resist coating block 3.

The substrate rest parts PASS3 and PASS4 extend through the partition 25. Each of the substrate rest parts PASS3 and PASS4 includes an optical sensor (not shown) for detecting the presence or absence of a substrate W thereon. Based on a detection signal from each of the sensors, a judgment is made as to whether or not the transport robots TR1 and TR2 stand ready to transfer and receive a substrate W to and from the substrate rest parts PASS3 and PASS4. A pair of (upper and lower) cool plates WCP of a water-cooled type for roughly cooling a substrate W are provided under the substrate rest parts PASS3 and PASS4, and extend through the partition 25 (See FIG. 4).

The resist coating block 3 is a processing block for applying a resist onto a substrate W coated with the anti-reflective film by the BARC block 2 to form a resist film. In this preferred embodiment, a chemically amplified resist is used as the photoresist. The resist coating block 3 includes a resist coating processor SC for forming the resist film by coating on the anti-reflective film serving as the undercoating film, a pair of thermal processing towers 31 for performing a thermal process which accompanies the resist coating process, and the transport robot TR2 for transferring and receiving a substrate W to and from the resist coating processor SC and the pair of thermal processing towers 31.

In the resist coating block 3, the resist coating processor SC and the pair of thermal processing towers 31 are arranged on opposite sides of the transport robot TR2. Specifically, the resist coating processor SC is on the front side of the substrate processing apparatus, and the pair of thermal processing towers 31 are on the rear side thereof. Additionally, a thermal barrier not shown is provided on the front side of the pair of thermal processing towers 31. Thus, the thermal effect of the pair of thermal processing towers 31 upon the resist coating processor SC is avoided by spacing the resist coating processor SC apart from the pair of thermal processing towers 31 and by providing the thermal barrier.

As shown in FIG. 2, the resist coating processor SC includes three coating processing units SC1, SC2 and SC3 similar in construction to each other and arranged in stacked relation in bottom-to-top order. The three coating processing units SC1, SC2 and SC3 are collectively referred to as the resist coating processor SC, unless otherwise identified. Each of the coating processing units SC1, SC2 and SC3 includes a spin chuck 32 for rotating a substrate W in a substantially horizontal plane while holding the substrate W in a substantially horizontal position under suction, a coating nozzle 33 for applying a resist solution onto the substrate W held on the spin chuck 32, a spin motor (not shown) for rotatably driving the spin chuck 32, a cup (not shown) surrounding the substrate W held on the spin chuck 32, and the like.

As shown in FIG. 3, one of the thermal processing towers 31 which is closer to the indexer block 1 includes six heating parts PHP1 to PHP6 arranged in stacked relation in bottom-to-top order for heating a substrate W up to a predetermined temperature. The other of the thermal processing towers 31 which is farther from the indexer block 1 includes cool plates CP4 to CP9 arranged in stacked relation in bottom-to-top order for cooling a heated substrate W down to a predetermined temperature and maintaining the substrate W at the predetermined temperature.

Each of the heating parts PHP1 to PHP6 is a thermal processing unit including, in addition to an ordinary hot plate for heating a substrate W placed thereon, a temporary substrate rest part for placing a substrate W in an upper position spaced apart from the hot plate, and a local transport mechanism 34 (See FIG. 1) for transporting a substrate W between the hot plate and the temporary substrate rest part. The local transport mechanism 34 is capable of moving up and down and moving back and forth, and includes a mechanism for cooling down a substrate W being transported by circulating cooling water therein.

The local transport mechanism 34 is provided on the opposite side of the above-mentioned hot plate and the temporary substrate rest part from the transport robot TR2, that is, on the rear side of the substrate processing apparatus. The temporary substrate rest part has both an open side facing the transport robot TR2 and an open side facing the local transport mechanism 34. The hot plate, on the other hand, has only an open side facing the local transport mechanism 34, and a closed side facing the transport robot TR2. Thus, both of the transport robot TR2 and the local transport mechanism 34 can gain access to the temporary substrate rest part, but only the local transport mechanism 34 can gain access to the hot plate. The heating parts PHP1 to PHP6 are generally similar in construction (FIGS. 7A and 7B) to heating parts PHP7 to PHP12 in the development processing block 4 to be described later.

A substrate W is transported into each of the above-mentioned heating parts PHP1 to PHP6 having such a construction in a manner to be described below. First, the transport robot TR2 places a substrate W onto the temporary substrate rest part. Subsequently, the local transport mechanism 34 receives the substrate W from the temporary substrate rest part to transport the substrate W to the hot plate. The hot plate performs a heating process on the substrate W. The local transport mechanism 34 takes out the substrate W subjected to the heating process by the hot plate, and transports the substrate W to the temporary substrate rest part. During the transport, the substrate W is cooled down by the cooling function of the local transport mechanism 34. Thereafter, the transport robot TR2 takes out the substrate W subjected to the heating process and transported to the temporary substrate rest part.

In this manner, the transport robot TR2 transfers and receives the substrate W to and from only the temporary substrate rest part held at room temperature in each of the heating parts PHP1 to PHP6, but does not transfer and receive the substrate W directly to and from the hot plate. This avoids the temperature rise of the transport robot TR2. The hot plate having only the open side facing the local transport mechanism 34 prevents the heat atmosphere leaking out of the hot plate from affecting the transport robot TR2 and the resist coating processor SC. The transport robot TR2 transfers and receives a substrate W directly to and from the cool plates CP4 to CP9.

The transport robot TR2 is precisely identical in construction with the transport robot TR1. Thus, the transport robot TR2 is capable of causing each of a pair of holding arms thereof to independently gain access to the substrate rest parts PASS3 and PASS4, the thermal processing units provided in the thermal processing towers 31, the coating processing units provided in the resist coating processor SC, and the substrate rest parts PASS5 and PASS6 to be described later, thereby transferring and receiving substrates W to and from the above-mentioned parts and units.

Next, the development processing block 4 will be described. The development processing block 4 is provided so as to be sandwiched between the resist coating block 3 and the interface block 5. A partition 35 for closing off the communication of atmosphere is also provided between the resist coating block 3 and the development processing block 4. The partition 35 is provided with the pair of vertically arranged substrate rest parts PASS5 and PASS6 each for placing a substrate W thereon for the transfer of the substrate W between the resist coating block 3 and the development processing block 4. The substrate rest parts PASS5 and PASS6 are similar in construction to the above-mentioned substrate rest parts PASS1 and PASS2.

The upper substrate rest part PASS5 is used for the transport of a substrate W from the resist coating block 3 to the development processing block 4. Specifically, a transport robot TR3 of the development processing block 4 receives the substrate W placed on the substrate rest part PASS5 by the transport robot TR2 of the resist coating block 3. The lower substrate rest part PASS6, on the other hand, is used for the transport of a substrate W from the development processing block 4 to the resist coating block 3. Specifically, the transport robot TR2 of the resist coating block 3 receives the substrate W placed on the substrate rest part PASS6 by the transport robot TR3 of the development processing block 4.

The substrate rest parts PASS5 and PASS6 extend through the partition 35. Each of the substrate rest parts PASS5 and PASS6 includes an optical sensor (not shown) for detecting the presence or absence of a substrate W thereon. Based on a detection signal from each of the sensors, a judgment is made as to whether or not the transport robots TR2 and TR3 stand ready to transfer and receive a substrate W to and from the substrate rest parts PASS5 and PASS6. A pair of (upper and lower) cool plates WCP of a water-cooled type for roughly cooling a substrate W are provided under the substrate rest parts PASS5 and PASS6, and extend through the partition 35 (See FIG. 4).

The development processing block 4 is a processing block for performing a development process on a substrate W subjected to an exposure process. The development processing block 4 is also capable of cleaning and drying a substrate W subjected to an immersion exposure process. The development processing block 4 includes a development processor SD for applying a developing solution onto a substrate W exposed in a pattern to perform the development process, a cleaning processor SOAK for performing a cleaning process and a drying process on a substrate W subjected to the immersion exposure process, a pair of thermal processing towers 41 and 42 for performing a thermal process which accompanies the development process, and the transport robot TR3 for transferring and receiving a substrate W to and from the development processor SD, the cleaning processor SOAK and the pair of thermal processing towers 41 and 42. The transport robot TR3 is precisely identical in construction with the above-mentioned transport robots TR1 and TR2.

As shown in FIG. 2, the development processor SD includes four development processing units SD1, SD2, SD3 and SD4 similar in construction to each other and arranged in stacked relation in bottom-to-top order. The four development processing units SD1 to SD4 are collectively referred to as the development processor SD, unless otherwise identified. Each of the development processing units SD1 to SD4 includes a spin chuck 43 for rotating a substrate W in a substantially horizontal plane while holding the substrate W in a substantially horizontal position under suction, a nozzle 44 for applying the developing solution onto the substrate W held on the spin chuck 43, a spin motor (not shown) for rotatably driving the spin chuck 43, a cup (not shown) surrounding the substrate W held on the spin chuck 43, and the like.

The cleaning processor SOAK includes a single cleaning processing unit SOAK1. As shown in FIG. 2, the cleaning processing unit SOAK1 is disposed under the development processing unit SD1. FIG. 6 is a view for illustrating the construction of the cleaning processing unit SOAK1. The cleaning processing unit SOAK1 includes a spin chuck 421 for rotating a substrate W about a vertical rotation axis passing through the center of the substrate W while holding the substrate W in a horizontal position.

The spin chuck 421 is fixed on the upper end of a rotary shaft 425 rotated by an electric motor not shown. The spin chuck 421 is formed with a suction passage (not shown). With the substrate W placed on the spin chuck 421, exhausting air from the suction passage allows the lower surface of the substrate W to be vacuum-held on the spin chuck 421, whereby the substrate W is held in a horizontal position.

A first pivoting motor 460 is provided on one side of the spin chuck 421. A first pivoting shaft 461 is connected to the first pivoting motor 460. A first arm 462 is coupled to the first pivoting shaft 461 so as to extend in a horizontal direction, and a cleaning processing nozzle 450 is provided on a distal end of the first arm 462. The first pivoting motor 460 drives the first pivoting shaft 461 to rotate, and drives the first arm 462 to pivot, whereby the cleaning processing nozzle 450 moves to over the substrate W held by the spin chuck 421.

A tip of a cleaning supply pipe 463 is connected in communication with the cleaning processing nozzle 450. The cleaning supply pipe 463 is connected in communication with a cleaning liquid supply source R1 and a rinsing liquid supply source R2 through a valve Va and a valve Vb, respectively. Controlling the opening and closing of the valves Va and Vb allows the selection of a processing liquid to be supplied to the cleaning supply pipe 463 and the adjustment of the amount of supply thereof. Specifically, a cleaning liquid is supplied to the cleaning supply pipe 463 by opening the valve Va, and a rinsing liquid is supplied to the cleaning supply pipe 463 by opening the valve Vb.

The cleaning liquid supplied from the cleaning liquid supply source R1 or the rinsing liquid supplied from the rinsing liquid supply source R2 is fed through the cleaning supply pipe 463 to the cleaning processing nozzle 450. This provides the cleaning liquid or the rinsing liquid from the cleaning processing nozzle 450 to the surface of the substrate W. Examples of the cleaning liquid used herein include deionized water, a solution of a complex (ionized) in deionized water, and a fluorine-based chemical solution. Examples of the rinsing liquid used herein include deionized water, carbonated water, hydrogen-dissolved water, electrolytic ionized water, and HFE (hydrofluoroether). A two-fluid nozzle which mixes droplets into a gas to eject the mixture may be used as the cleaning processing nozzle 450.

A second pivoting motor 470 is provided on a different side of the spin chuck 421 than the above-mentioned side. A second pivoting shaft 471 is connected to the second pivoting motor 470. A second arm 472 is coupled to the second pivoting shaft 471 so as to extend in a horizontal direction, and a drying processing nozzle 451 is provided on a distal end of the second arm 472. The second pivoting motor 470 drives the second pivoting shaft 471 to rotate, and drives the second arm 472 to pivot, whereby the drying processing nozzle 451 moves to over the substrate W held by the spin chuck 421.

A tip of a drying supply pipe 473 is connected in communication with the drying processing nozzle 451. The drying supply pipe 473 is connected in communication with an inert gas supply source R3 through a valve Vc. Controlling the opening and closing of the valve Vc allows the adjustment of the amount of inert gas to be supplied to the drying supply pipe 473.

The inert gas supplied from the inert gas supply source R3 is fed through the drying supply pipe 473 to the drying processing nozzle 451. This provides the inert gas from the drying processing nozzle 451 to the surface of the substrate W. Examples of the inert gas used herein include nitrogen gas ($N_2$) and argon gas (Ar).

When supplying the cleaning liquid or the rinsing liquid to the surface of the substrate W, the cleaning processing nozzle 450 is positioned over the substrate W held by the spin chuck 421 whereas the drying processing nozzle 451 is retracted to a predetermined position. When supplying the inert gas to the surface of the substrate W, on the other hand, the drying processing nozzle 451 is positioned over the substrate W held by the spin chuck 421 whereas the cleaning processing nozzle 450 is retracted to a predetermined position, as shown in FIG. 6.

The substrate W held by the spin chuck 421 is surrounded by a processing cup 423. A cylindrical partition wall 433 is provided inside the processing cup 423. A drainage space 431 for draining the processing liquid (the cleaning liquid or the rinsing liquid) used for the processing of the substrate W is formed inside the partition wall 433 so as to surround the spin chuck 421. A collected liquid space 432 for collecting the processing liquid used for the processing of the substrate W is formed between the outer wall of the processing cup 423 and the partition wall 433 so as to surround the drainage space 431.

A drainage pipe 434 for introducing the processing liquid to a drainage processing apparatus (not shown) is connected to the drainage space 431, and a collection pipe 435 for introducing the processing liquid to a collection processing apparatus (not shown) is connected to the collected liquid space 432.

A splash guard 424 for preventing the processing liquid from the substrate W from splashing outwardly is provided over the processing cup 423. The splash guard 424 has a configuration rotationally symmetric with respect to the rotary shaft 425. A drainage guide groove 441 of a dog-legged sectional configuration is formed annularly in the inner surface of an upper end portion of the splash guard 424. A collected liquid guide portion 442 defined by an outwardly downwardly inclined surface is formed in the inner surface of a lower end portion of the splash guard 424. A partition wall receiving groove 443 for receiving the partition wall 433 in the processing cup 423 is formed near the upper end of the collected liquid guide portion 442.

The splash guard 424 is driven to move upwardly and downwardly in a vertical direction by a guard driving mechanism (not shown) including a ball screw mechanism and the like. The guard driving mechanism moves the splash guard 424 upwardly and downwardly between a collection position in which the collected liquid guide portion 442 surrounds the edge portion of the substrate W held by the spin chuck 421 and a drainage position in which the drainage guide groove 441 surrounds the edge portion of the substrate W held by the spin chuck 421. When the splash guard 424 is in the collection position (or the position shown in FIG. 6), the processing liquid splashed from the edge portion of the substrate W is guided by the collected liquid guide portion 442 into the collected liquid space 432, and is then collected through the collection pipe 435. When the splash guard 424 is in the drainage position, on the other hand, the processing liquid splashed from the edge portion of the substrate W is guided by the drainage guide groove 441 into the drainage space 431, and is then drained through the drainage pipe 434. In this manner, the drainage and collection of the processing liquid can be selectively carried out.

Referring again to FIG. 3, the thermal processing tower 41 which is closer to the indexer block 1 includes five hot plates HP7 to HP11 for heating a substrate W up to a predetermined temperature, and cool plates CP10 to CP13 for cooling a heated substrate W down to a predetermined temperature and for maintaining the substrate W at the predetermined temperature. The cool plates CP10 to CP13 and the hot plates HP7 to HP11 are arranged in stacked relation in bottom-to-top order in this thermal processing tower 41.

The thermal processing tower 42 which is farther from the indexer block 1, on the other hand, includes the six heating parts PHP7 to PHP12 and a cool plate CP14 which are arranged in stacked relation. Like the above-mentioned heating parts PHP1 to PHP6, each of the heating parts PHP7 to PHP12 is a thermal processing unit including a temporary substrate rest part and a local transport mechanism.

FIGS. 7A and 7B schematically show the construction of the heating part PHP7 with the temporary substrate rest part.

FIG. 7A is a side sectional view of the heating part PHP7, and FIG. 7B is a plan view of the heating part PHP7. Although the heating part PHP7 is shown in FIGS. 7A and 7B, the heating parts PHP8 to PHP12 are precisely identical in construction with the heating part PHP7. The heating part PHP7 includes a heating plate 710 for performing a heating process on a substrate W placed thereon, a temporary substrate rest part 719 for placing a substrate W in an upper or lower position (in this preferred embodiment, an upper position) spaced apart from the heating plate 710, and a local transport mechanism 720 specific to a thermal processing part for transporting a substrate W between the heating plate 710 and the temporary substrate rest part 719. The heating plate 710 is provided with a plurality of movable support pins 721 extendable out of and retractable into the plate surface. A vertically movable top cover 722 for covering a substrate W during the heating process is provided over the heating plate 710. The temporary substrate rest part 719 is provided with a plurality of fixed support pins 723 for supporting a substrate W.

The local transport mechanism 720 includes a holding plate 724 for holding a substrate W in a substantially horizontal position. The holding plate 724 is moved upwardly and downwardly by a screw feed drive mechanism 725, and is moved back and forth by a belt drive mechanism 726. The holding plate 724 is provided with a plurality of slits 724a so as not to interfere with the movable support pins 721 and the fixed support pins 723 when the holding plate 724 moves to over the heating plate 710 and moves into the temporary substrate rest part 719.

The local transport mechanism 720 further includes a cooling element for cooling a substrate W in the course of the transport of the substrate W from the heating plate 710 to the temporary substrate rest part 719. As illustrated in FIG. 7B, the cooling element may be constructed so that a cooling water passage 724b through which a cooling water flows is provided inside the holding plate 724. The cooling element may be constructed so that, for example, a Peltier device or the like is provided inside the holding plate 724.

The above-mentioned local transport mechanism 720 is provided at the rear of (i.e., on the (+Y) side relative to) the heating plate 710 and the temporary substrate rest part 719 in the apparatus. A transport robot TR4 of the interface block 5 is disposed on the (+X) side relative to the heating plate 710 and the temporary substrate rest part 719, and the transport robot TR3 of the development processing block 4 is disposed on the (−Y) side relative to the heating plate 710 and the temporary substrate rest part 719. In an upper portion of an enclosure 727 covering the heating plate 710 and the temporary substrate rest part 719, i.e., a portion of the enclosure 727 which covers the temporary substrate rest part 719, an opening 719a for allowing the transport robot TR4 to enter the temporary substrate rest part 719 is provided on the (+X) side thereof, and an opening 719b for allowing the local transport mechanism 720 to enter the temporary substrate rest part 719 is provided on the (+Y) side thereof. In a lower portion of the enclosure 727, i.e., a portion of the enclosure 727 which covers the heating plate 710, the (+X) and (−Y) sides thereof (i.e., the surfaces of the enclosure 727 opposed to the transport robot TR3 and the transport robot TR4) are provided with no openings, and an opening 719c for allowing the local transport mechanism 720 to enter the heating plate 710 is provided on the (+Y) side thereof.

A substrate W is carried into and out of the above-mentioned heating part PHP7 in a manner to be described below. First, the transport robot TR4 of the interface block 5 holds an exposed substrate W, and places the substrate W onto the fixed support pins 723 of the temporary substrate rest part 719. Subsequently, the holding plate 724 of the local transport mechanism 720 moves to under the substrate W, and then moves slightly upwardly to receive the substrate W from the fixed support pins 723. The holding plate 724 which holds the substrate W moves backwardly out of the enclosure 727, and moves downwardly to a position opposed to the heating plate 710. At this time, the movable support pins 721 of the heating plate 710 are in a lowered position, and the top cover 722 is in a raised position. The holding plate 724 which holds the substrate W moves to over the heating plate 710. After the movable support pins 721 move upwardly and receive the substrate W in a receiving position, the holding plate 724 moves backwardly out of the enclosure 727. Subsequently, the movable support pins 721 move downwardly to place the substrate W onto the heating plate 710, and the top cover 722 moves downwardly to cover the substrate W. In this state, the substrate W is subjected to the heating process. After the heating process, the top cover 722 moves upwardly, and the movable support pins 721 move upwardly to lift the substrate W. Next, after the holding plate 724 moves to under the substrate W, the movable support pins 721 move downwardly to transfer the substrate W to the holding plate 724. The holding plate 724 which holds the substrate W moves backwardly out of the enclosure 727, and then moves upwardly to transport the substrate W to the temporary substrate rest part 719. In the course of the transport, the substrate W supported by the holding plate 724 is cooled by the cooling element of the holding plate 724. The holding plate 724 brings the substrate W cooled (to approximately room temperature) onto the fixed support pins 723 of the temporary substrate rest part 719. The transport robot TR4 takes out and transports the substrate W.

The transport robot TR4 transfers and receives the substrate W to and from only the temporary substrate rest part 719, but does not transfer and receive the substrate W to and from the heating plate 710. This avoids the temperature rise of the transport robot TR4. Additionally, the opening 719c through which the substrate W is placed onto and removed from the heating plate 710 is formed only on the side of the local transport mechanism 720. This prevents the heat atmosphere leaking out through the opening 719c from raising the temperatures of the transport robot TR3 and the transport robot TR4 and also from affecting the development processor SD and the cleaning processor SOAK.

As described above, the transport robot TR4 of the interface block 5 can gain access to the heating parts PHP7 to PHP12 and the cool plate CP14, but the transport robot TR3 of the development processing block 4 cannot gain access thereto. The transport robot TR3 of the development processing block 4 gains access to the thermal processing units incorporated in the thermal processing tower 41.

The pair of vertically arranged substrate rest parts PASS7 and PASS8 in proximity to each other for the transfer of a substrate W between the development processing block 4 and the interface block 5 adjacent thereto are incorporated in the topmost tier of the thermal processing tower 42. The upper substrate rest part PASS7 is used for the transport of a substrate W from the development processing block 4 to the interface block 5. Specifically, the transport robot TR4 of the interface block 5 receives the substrate W placed on the substrate rest part PASS7 by the transport robot TR3 of the development processing block 4. The lower substrate rest part PASS8, on the other hand, is used for the transport of a substrate W from the interface block 5 to the development processing block 4. Specifically, the transport robot TR3 of the development processing block 4 receives the substrate W placed on the substrate rest part PASS8 by the transport robot TR4 of the interface block 5. Each of the substrate rest parts PASS7 and PASS8 includes both an open side facing the transport robot TR3 of the development processing block 4 and an open side facing the transport robot TR4 of the interface block 5.

Next, the interface block 5 will be described. The interface block 5 is a block provided adjacent to the development processing block 4. The interface block 5 receives a substrate W with the resist film formed thereon by the resist coating process from the resist coating block 3 to transfer the substrate W to the exposure unit EXP which is an external apparatus separate from the substrate processing apparatus according to the present invention. Also, the interface block 5 receives an exposed substrate W from the exposure unit EXP to transfer the exposed substrate W to the development processing block 4. The interface block 5 in this preferred embodiment includes a transport mechanism 55 for transferring and receiving a substrate W to and from the exposure unit EXP, a pair of edge exposure units EEW1 and EEW2 for exposing the periphery of a substrate W formed with the resist film, and the transport robot TR4 for transferring and receiving a substrate W to and from the heating parts PHP7 to PHP12 and cool plate CP14 provided in the development processing block 4 and the edge exposure units EEW1 and EEW2.

As shown in FIG. 2, each of the edge exposure units EEW1 and EEW2 (collectively referred to as an edge exposure part EEW, unless otherwise identified) includes a spin chuck 56 for rotating a substrate W in a substantially horizontal plane while holding the substrate W in a substantially horizontal position under suction, a light irradiator 57 for exposing the periphery of the substrate W held on the spin chuck 56 to light, and the like. The pair of edge exposure units EEW1 and EEW2 are arranged in vertically stacked relation in the center of the interface block 5. The transport robot TR4 provided adjacent to the edge exposure part EEW and the thermal processing tower 42 of the development processing block 4 is similar in construction to the above-mentioned transport robots TR1 to TR3.

With reference to FIGS. 2 and 8, description will be further continued. FIG. 8 is a side view of the interface block 5 as seen from the (+X) side. A return buffer RBF for the return of substrates W is provided under the pair of edge exposure units EEW1 and EEW2, and the pair of vertically arranged substrate rest parts PASS9 and PASS10 are provided under the return buffer RBF. The return buffer RBF is provided to temporarily store a substrate W subjected to a post-exposure bake process in the heating parts PHP7 to PHP12 of the development processing block 4 if the development processing block 4 is unable to perform the development process on the substrate W because of some sort of malfunction and the like. The return buffer RBF includes a cabinet capable of storing a plurality of substrates W in tiers. The upper substrate rest part PASS9 is used for the transfer of a substrate W from the transport robot TR4 to the transport mechanism 55. The lower substrate rest part PASS10 is used for the transfer of a substrate W from the transport mechanism 55 to the transport robot TR4. The transport robot TR4 gains access to the return buffer RBF.

As shown in FIG. 8, the transport mechanism 55 includes a movable base 55a in threaded engagement with a threaded shaft 522. The threaded shaft 522 is rotatably supported by a pair of support bases 523 so that the rotation axis thereof extends along the Y axis. The threaded shaft 522 has one end coupled to a motor M1. The motor M1 drives the threaded shaft 522 to rotate, thereby moving the movable base 55a horizontally along the Y axis.

A pair of holding arms 59a and 59b for holding a substrate W is mounted on the movable base 55a so as to be arranged vertically. The pair of holding arms 59a and 59b are movable upwardly and downwardly, pivotable, and movable back and forth in the direction of the pivot radius independently of each other by a drive mechanism incorporated in the movable base 55a. With such an arrangement, the transport mechanism 55 transfers and receives a substrate W to and from the exposure unit EXP, transfers and receives a substrate W to and from the substrate rest parts PASS9 and PASS10, and stores and takes a substrate W into and out of a send buffer SBF for the sending of substrates W. The send buffer SBF is provided to temporarily store a substrate W prior to the exposure process if the exposure unit EXP is unable to accept the substrate W, and includes a cabinet capable of storing a plurality of substrates W in tiers.

As shown in FIGS. 2 and 8, the cleaning processing unit SOAK1 has an opening 58 on the (+X) side. Thus, the transport mechanism 55 can transfer and receive a substrate W to and from the cleaning processing unit SOAK1 through the opening 58.

A downflow of clean air is always supplied into the indexer block 1, the BARC block 2, the resist coating block 3, the development processing block 4, and the interface block 5 described above to thereby avoid the adverse effects of raised particles and gas flows upon the processes in the respective blocks 1 to 5. Additionally, a slightly positive pressure relative to the external environment of the substrate processing apparatus is maintained in each of the blocks 1 to 5 to prevent the entry of particles and contaminants from the external environment into the blocks 1 to 5.

The indexer block 1, the BARC block 2, the resist coating block 3, the development processing block 4 and the interface block 5 as described above are units into which the substrate processing apparatus of this preferred embodiment is divided in mechanical terms. The blocks 1 to 5 are assembled to individual block frames, respectively, which are in turn connected together to construct the substrate processing apparatus.

On the other hand, this preferred embodiment employs another type of units, that is, transport control units regarding the transport of substrates, aside from the blocks which are units based on the above-mentioned mechanical division. The transport control units regarding the transport of substrates are referred to herein as "cells." Each of the cells includes a transport robot responsible for the transport of substrates, and a transport destination part to which the transport robot transports a substrate. Each of the substrate rest parts described above functions as an entrance substrate rest part for the receipt of a substrate W into a cell or as an exit substrate rest part for the transfer of a substrate W out of a cell. The transfer of substrates W between the cells is also carried out through the substrate rest parts. The transport robots constituting the cells include the substrate transfer mechanism 12 of the indexer block 1 and the transport mechanism 55 of the interface block 5.

The substrate processing apparatus in this preferred embodiment includes six cells: an indexer cell, a BARC cell, a resist coating cell, a development processing cell, a post-exposure bake cell, and an interface cell. The indexer cell includes the table 11 and the substrate transfer mechanism 12, and is consequently similar in construction to the indexer block 1 which is one of the units based on the mechanical division. The BARC cell includes the bottom coating processor BRC, the pair of thermal processing towers 21 and the transport robot TR1. The BARC cell is also consequently similar in construction to the BARC block 2 which is one of the units based on the mechanical division. The resist coating cell includes the resist coating processor SC, the pair of thermal processing towers 31, and the transport robot TR2. The resist coating cell is also consequently similar in construction to the resist coating block 3 which is one of the units based on the mechanical division.

The development processing cell includes the development processor SD, the thermal processing tower 41, and the transport robot TR3. Because the transport robot TR3 cannot gain access to the heating parts PHP7 to PHP12 and the cool plate CP14 of the thermal processing tower 42 as discussed above, the development processing cell does not include the thermal processing tower 42. Because the transport mechanism 55 of the interface block 5 gains access to the cleaning processing unit SOAK1 of the cleaning processor SOAK, the cleaning processor SOAK is also not included in the development processing cell. In these respects, the development processing cell differs from the development processing block 4 which is one of the units based on the mechanical division.

The post-exposure bake cell includes the thermal processing tower 42 positioned in the development processing block 4, the edge exposure part EEW positioned in the interface block 5, and the transport robot TR4 positioned in the interface block 5. That is, the post-exposure bake cell extends over the development processing block 4 and the interface block 5 which are units based on the mechanical division. In this manner, constituting one cell including the heating parts PHP7 to PHP12 for performing the post-exposure bake process and the transport robot TR4 allows the rapid transport of exposed substrates W into the heating parts PHP7 to PHP12 for the execution of the thermal process. Such an arrangement is preferred for the use of a chemically amplified resist which is required to be subjected to a heating process as soon as possible after the exposure of a substrate W in a pattern.

The substrate rest parts PASS7 and PASS8 included in the thermal processing tower 42 are provided for the transfer of a substrate W between the transport robot TR3 of the development processing cell and the transport robot TR4 of the post-exposure bake cell.

The interface cell includes the transport mechanism 55 for transferring and receiving a substrate W to and from the exposure unit EXP which is an external apparatus, and the cleaning processor SOAK. The interface cell has a construction different from that of the interface block 5 which is one of the units based on the mechanical division in that the interface cell includes the cleaning processor SOAK positioned in the development processing block 4 and does not include the transport robot TR4 and the edge exposure part EEW. The substrate rest parts PASS9 and PASS10 under the edge exposure part EEW are provided for the transfer of a substrate W between the transport robot TR4 of the post-exposure bake cell and the transport mechanism 55 of the interface cell.

Figure 9:
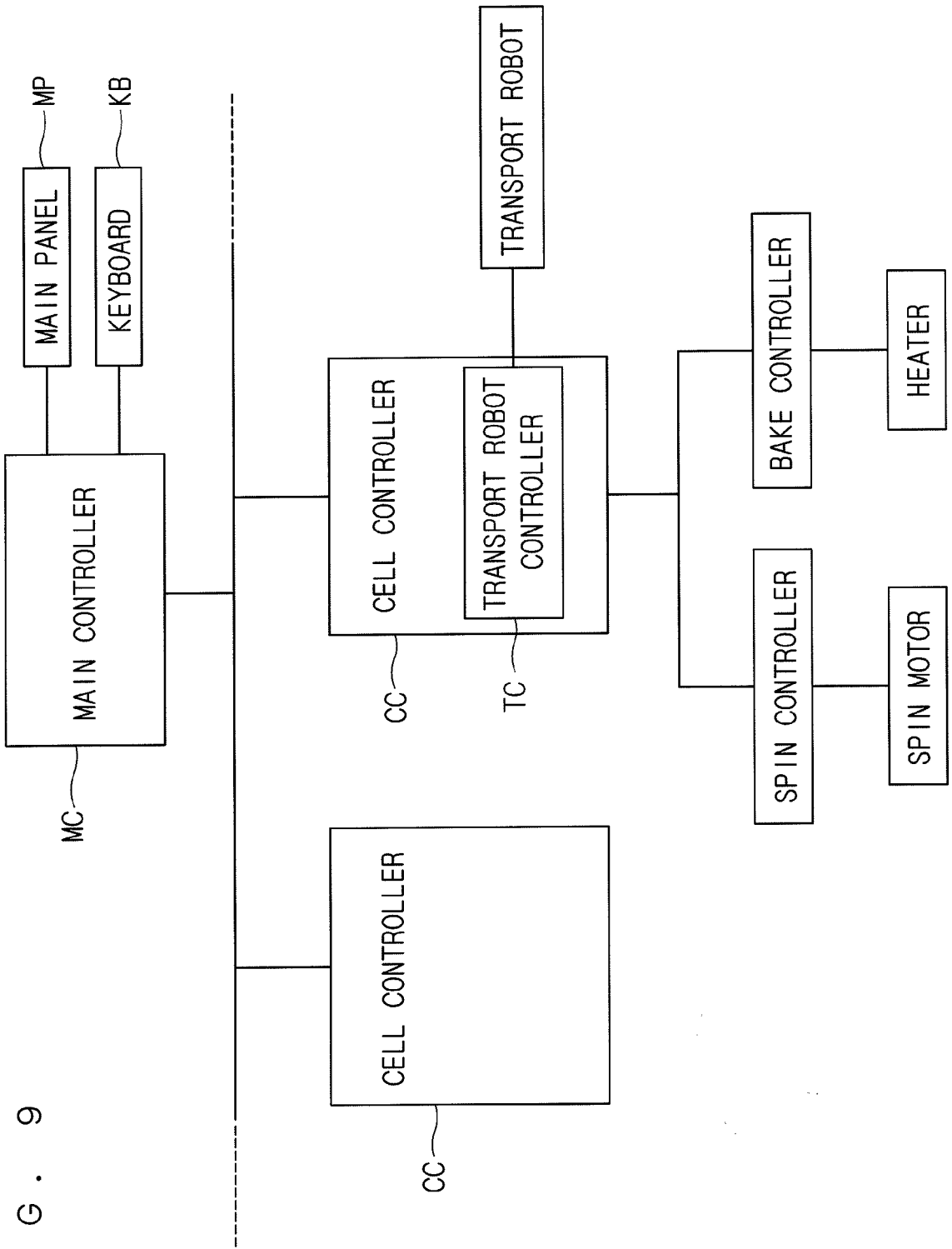
FIG. 9 is a block diagram schematically showing a control mechanism.

Next, a control mechanism in the substrate processing apparatus of this preferred embodiment will be described. FIG. 9 is a schematic block diagram of the control mechanism. As shown in FIG. 9, the substrate processing apparatus of this preferred embodiment has a three-level control hierarchy composed of a main controller MC, cell controllers CC, and unit controllers. The main controller MC, the cell controllers CC and the unit controllers are similar in hardware construction to typical computers. Specifically, each of the controllers includes a CPU for performing various computation processes, a ROM or read-only memory for storing a basic program therein, a RAM or readable/writable memory for storing various pieces of information therein, a magnetic disk for storing control applications and data therein, and the like.

The single main controller MC at the first level is provided for the entire substrate processing apparatus, and is principally responsible for the management of the entire substrate processing apparatus, the management of a main panel MP, and the management of the cell controllers CC. The main panel MP functions as a display for the main controller MC. Various commands and parameters may be entered into the main controller MC from a keyboard KB. The main panel MP may be in the form of a touch panel so that a user performs an input process into the main controller MC from the main panel MP.

The cell controllers CC at the second level are individually provided in corresponding relation to the six cells (the indexer cell, the BARC cell, the resist coating cell, the development processing cell, the post-exposure bake cell, and the interface cell). Each of the cell controllers CC is principally responsible for the control of the transport of substrates and the management of the units in a corresponding cell. Specifically, the cell controllers CC for the respective cells send and receive information in such a manner that a first cell controller CC for a first cell sends information indicating that a substrate W is placed on a predetermined substrate rest part to a second cell controller CC for a second cell adjacent to the first cell, and the second cell controller CC for the second cell having received the substrate W sends information indicating that the substrate W is received from the predetermined substrate rest part back to the first cell controller CC. Such sending and receipt of information are carried out through the main controller MC. Each of the cell controllers CC provides the information indicating that a substrate W is transported into a corresponding cell to a transport robot controller TC, which in turn controls a corresponding transport robot to circulatingly transport the substrate W in the corresponding cell in accordance with a predetermined procedure. The transport robot controller TC is a controller implemented by the operation of a predetermined application in the corresponding cell controller CC.

Examples of the unit controllers at the third level include a spin controller and a bake controller. The spin controller directly controls the spin units (the coating processing units, the development processing units and the cleaning processing unit) provided in a corresponding cell in accordance with an instruction given from a corresponding cell controller CC. Specifically, the spin controller controls, for example, a spin motor for a spin unit to adjust the number of revolutions of a substrate W. The bake controller directly controls the thermal processing units (the hot plates, the cool plates, the heating parts, and the like) provided in a corresponding cell in accordance with an instruction given from a corresponding cell controller CC. Specifically, the bake controller controls, for example, a heater incorporated in a hot plate to adjust a plate temperature and the like.

The host computer 100 connected via the LAN lines to the substrate processing apparatus ranks as a higher level control mechanism than the three-level control hierarchy provided in the substrate processing apparatus (See FIG. 1). The host computer 100 includes a CPU for performing various computation processes, a ROM or read-only memory for storing a basic program therein, a RAM or readable/writable memory for storing various pieces of information therein, a magnetic disk for storing control applications and data therein, and the like. The host computer 100 is similar in construction to a typical computer. Typically, a plurality of substrate processing apparatuses according to this preferred embodiment are connected to the host computer 100. The host computer 100 provides a recipe containing descriptions about a processing procedure and processing conditions to each of the substrate processing apparatuses connected thereto. The recipe provided from the host computer 100 is stored in a storage part (e.g., a memory) of the main controller MC of each of the substrate processing apparatuses.

The exposure unit EXP is provided with a separate controller independent of the above-mentioned control mechanism of the substrate processing apparatus. In other words, the exposure unit EXP does not operate under the control of the main controller MC of the substrate processing apparatus, but controls its own operation alone. Such an exposure unit EXP also controls its own operation in accordance with a recipe received from the host computer 100.

Next, the operation of the substrate processing apparatus of this preferred embodiment will be described. First, description will be given on a general procedure for the circulating transport of substrates W in the substrate processing apparatus. The processing procedure to be described below is in accordance with the descriptions of the recipe received from the host computer 100.

First, unprocessed substrates W stored in a cassette C are transported from the outside of the substrate processing apparatus into the indexer block 1 by an AGV (automatic guided vehicle) and the like. Subsequently, the unprocessed substrates W are transferred outwardly from the indexer block 1. Specifically, the substrate transfer mechanism 12 in the indexer cell (or the indexer block 1) takes an unprocessed substrate W out of a predetermined cassette C, and places the unprocessed substrate W onto the substrate rest part PASS1. After the unprocessed substrate W is placed on the substrate rest part PASS 1, the transport robot TR1 of the BARC cell uses one of the holding arms 6a and 6b to receive the unprocessed substrate W. The transport robot TR1 transports the received unprocessed substrate W to one of the coating processing units BRC1 to BRC3. In the coating processing units BRC1 to BRC3, the substrate W is spin-coated with the coating solution for the anti-reflective film.

After the completion of the coating process, the transport robot TR1 transports the substrate W to one of the hot plates HP1 to HP6. Heating the substrate W in the hot plate dries the coating solution to form the anti-reflective film serving as the undercoat on the substrate W. Thereafter, the transport robot TR1 takes the substrate W from the hot plate, and transports the substrate W to one of the cool plates CP1 to CP3, which in turn cools down the substrate W. In this step, one of the cool plates WCP may be used to cool down the substrate W. The transport robot TR1 places the cooled substrate W onto the substrate rest part PASS3.

Alternatively, the transport robot TR1 may be adapted to transport the unprocessed substrate W placed on the substrate rest part PASS1 to one of the adhesion promotion processing parts AHL1 to AHL3. In the adhesion promotion processing parts AHL1 to AHL3, the substrate W is thermally processed in a vapor atmosphere of HMDS, whereby the adhesion of the resist film to the substrate W is promoted. The transport robot TR1 takes out the substrate W subjected to the adhesion promotion process, and transports the substrate W to one of the cool plates CP1 to CP3, which in turn cools down the substrate W. Because no anti-reflective film is to be formed on the substrate W subjected to the adhesion promotion process, the cooled substrate W is directly placed onto the substrate rest part PASS3 by the transport robot TR1.

A dehydration process may be performed prior to the application of the coating solution for the anti-reflective film. In this case, the transport robot TR1 transports the unprocessed substrate W placed on the substrate rest part PASS1 first to one of the adhesion promotion processing parts AHL1 to AHL3. In the adhesion promotion processing parts AHL1 to AHL3, a heating process (dehydration bake) merely for dehydration is performed on the substrate W without supplying the vapor atmosphere of HMDS. The transport robot TR1 takes out the substrate W subjected to the heating process for dehydration, and transports the substrate W to one of the cool plates CP1 to CP3, which in turn cools down the substrate W. The transport robot TR1 transports the cooled substrate W to one of the coating processing units BRC1 to BRC3. In the coating processing units BRC1 to BRC3, the substrate W is spin-coated with the coating solution for the anti-reflective film. Thereafter, the transport robot TR1 transports the substrate W to one of the hot plates HP1 to HP6. Heating the substrate W in the hot plate forms the anti-reflective film serving as the undercoat on the substrate W. Thereafter, the transport robot TR1 takes the substrate W from the hot plate, and transports the substrate W to one of the cool plates CP1 to CP3, which in turn cools down the substrate W. Then, the transport robot TR1 places the cooled substrate W onto the substrate rest part PASS3.

After the substrate W is placed on the substrate rest part PASS3, the transport robot TR2 in the resist coating cell receives the substrate W, and transports the substrate W to one of the coating processing units SC1 to SC3. In the coating processing units SC1 to SC3, the substrate W is spin-coated with the resist. Because the resist coating process requires precise substrate temperature control, the substrate W may be transported to one of the cool plates CP4 to CP9 immediately before being transported to the coating processing units SC1 to SC3.

After the completion of the resist coating process, the transport robot TR2 transports the substrate W to one of the heating parts PHP1 to PHP6. In the heating parts PHP1 to PHP6, heating the substrate W removes a solvent component from the resist to form a resist film on the substrate W. Thereafter, the transport robot TR2 takes the substrate W from the one of the heating parts PHP1 to PHP6, and transports the substrate W to one of the cool plates CP4 to CP9, which in turn cools down the substrate W. Then, the transport robot TR2 places the cooled substrate W onto the substrate rest part PASS5.

After the substrate W with the resist film formed thereon by the resist coating process is placed on the substrate rest part PASS5, the transport robot TR3 in the development processing cell receives the substrate W, and places the substrate W onto the substrate rest part PASS7 without any processing of the substrate W. Then, the transport robot TR4 in the post-exposure bake cell receives the substrate W placed on the substrate rest part PASS7, and transports the substrate W to one of the edge exposure units EEW1 and EEW2. In the edge exposure units EEW1 and EEW2, a peripheral edge portion of the substrate W is exposed to light. The transport robot TR4 places the substrate W subjected to the edge exposure process onto the substrate rest part PASS9. The transport mechanism 55 in the interface cell receives the substrate W placed on the substrate rest part PASS9, and transports the substrate W into the exposure unit EXP. The substrate W transported into the exposure unit EXP is subjected to the pattern exposure process. In this step, the transport mechanism 55 uses the holding arm 59a to transport the substrate W from the substrate rest part PASS9 to the exposure unit EXP.

Because the chemically amplified resist is used in this preferred embodiment, an acid is formed by a photochemical reaction in the exposed portion of the resist film formed on the substrate W. In the exposure unit EXP, the substrate W is subjected to an immersion exposure process. The immersion exposure process refers to a technique for immersing a substrate W in a liquid with a high refractive index (e.g., deionized water with a refractive index of 1.44) to expose the substrate W in a pattern, and can achieve a high resolution with virtually no change of the conventional light source and exposure process. The substrate W subjected to the edge exposure process may be transported to the cool plate CP14 for the cooling process by the transport robot TR4 before being transported to the exposure unit EXP.

The exposed substrate W subjected to the pattern exposure process is transported from the exposure unit EXP back to the interface cell again. The transport mechanism 55 transports the exposed substrate W into the cleaning processing unit SOAK1. In this step, the transport mechanism 55 uses the holding arm 59b to transport the substrate W from the exposure unit EXP to the cleaning processing unit SOAK1. There are cases where a liquid adheres to the substrate W subjected to the immersion exposure process. However, the holding arm 59a is used for the transport of the substrate W prior to the exposure and the holding arm 59b is exclusively used for the transport of the substrate W after the exposure. This avoids the adhesion of the liquid to at least the holding arm 59a, to prevent the transfer of the liquid to the substrate W prior to the exposure.

A processing operation in the cleaning processing unit SOAK1 will be described. First, when a substrate W is transported into the cleaning processing unit SOAK1, the splash guard 424 is moved downwardly, and the transport mechanism 55 places the substrate W onto the spin chuck 421. The substrate W placed on the spin chuck 421 is held in a horizontal position under suction by the spin chuck 421.

Next, the splash guard 424 moves to the above-mentioned drainage position, and the cleaning processing nozzle 450 moves to over the center of the substrate W. Thereafter, the rotary shaft 425 starts rotating. As the rotary shaft 425 rotates, the substrate W held by the spin chuck 421 is rotated. Thereafter, the valve Va is opened to apply the cleaning liquid from the cleaning processing nozzle 450 onto the upper surface of the substrate W. In this preferred embodiment, deionized water is applied as the cleaning liquid onto the substrate W. Thus, the cleaning process of the substrate W proceeds to wash away the liquid for immersion exposure from the substrate W. The liquid splashed from the rotating substrate W by centrifugal force is guided by the drainage guide groove 441 into the drainage space 431, and is drained through the drainage pipe 434. In this preferred embodiment, because the deionized water is used as the cleaning liquid, an additional rinsing liquid is not supplied. In place of the valve Va, the valve Vb may be opened to discharge deionized water as the rinsing liquid from the cleaning processing nozzle 450.

After a lapse of a predetermined time period, the speed of rotation of the rotary shaft 425 decreases. This decreases the amount of deionized water serving as the cleaning liquid spattered by the rotation of the substrate W to form a film of water on the entire surface of the substrate W in such a manner that a puddle of water remains on the substrate W. Alternatively, a film of water may be formed on the entire surface of the substrate W by stopping the rotation of the rotary shaft 425.

Next, the supply of the cleaning liquid is stopped. The cleaning processing nozzle 450 is retracted to a predetermined position, and the drying processing nozzle 451 moves to over the center of the substrate W. Thereafter, the valve Vc is opened to apply an inert gas (in this preferred embodiment, nitrogen gas) from the drying processing nozzle 451 to near the center of the upper surface of the substrate W. Thus, the water or moisture in the center of the substrate W is forced toward the peripheral edge portion of the substrate W. As a result, the film of water remains only in the peripheral edge portion of the substrate W.

Next, the speed of rotation of the rotary shaft 425 increases again, and the drying processing nozzle 451 gradually moves from over the center of the substrate W toward over the peripheral edge portion of the substrate W. Thus, a great centrifugal force is exerted on the film of water remaining on the substrate W, and the inert gas can impinge on the entire surface of the substrate W, whereby the film of water on the substrate W is reliably removed. As a result, the substrate W is dried with reliability.

Next, the supply of the inert gas is stopped. The drying processing nozzle 451 is retracted to a predetermined position, and the rotation of the rotary shaft 425 is stopped. Thereafter, the splash guard 424 is moved downwardly, and the transport mechanism 55 transports the substrate W out of the cleaning processing unit SOAK1. This completes the processing operation in the cleaning processing unit SOAK1. The position of the splash guard 424 during the cleaning and drying processes is preferably appropriately changed depending on the need for the collection and drainage of the processing liquid.

The substrate W subjected to the cleaning and drying processes in the cleaning processing unit SOAK1 is placed on the substrate rest part PASS10 by the transport mechanism 55. In this step, the transport mechanism 55 uses the holding arm 59a to transport the substrate W from the cleaning processing unit SOAK1 to the substrate rest part PASS10. After the exposed substrate W is placed on the substrate rest part PASS10, the transport robot TR4 in the post-exposure bake cell receives the substrate W, and transports the substrate W to one of the heating parts PHP7 to PHP12. The processing operation in the heating parts PHP7 to PHP12 is as described above. In the heating parts PHP7 to PHP12, the heating process (or the post-exposure bake process) is performed which causes a reaction such as crosslinking, polymerization and the like of the resist resin to proceed by using a product formed by the photochemical reaction during the exposure process as an acid catalyst, thereby locally changing the solubility of only an exposed portion of the resist resin in the developing solution. The local transport mechanism 720 having the cooling mechanism transports the substrate W subjected to the post-exposure bake process to thereby cool down the substrate W, whereby the above-mentioned chemical reaction stops. Subsequently, the transport robot TR4 takes the substrate W from the one of the heating parts PHP7 to PHP12, and places the substrate W onto the substrate rest part PASS8. The procedure from the end of exposure in the exposure unit EXP to the start of the post-exposure bake process in the heating parts PHP7 to PHP12 will be described later.

After the substrate W is placed on the substrate rest part PASS8, the transport robot TR3 in the development processing cell receives the substrate W, and transports the substrate W to one of the cool plates CP10 to CP13. In the cool plates CP10 to CP13, the substrate W subjected to the post-exposure bake process is further cooled down and precisely controlled at a predetermined temperature. Thereafter, the transport robot TR3 takes the substrate W from the one of the cool plates CP10 to CP13, and transports the substrate W to one of the development processing units SD1 to SD4. In the development processing units SD1 to SD4, the developing solution is applied onto the substrate W to cause the development process to proceed. After the completion of the development process, the transport robot TR3 transports the substrate W to one of the hot plates HP7 to HP11, and then transports the substrate W to one of the cool plates CP10 to CP13.

Thereafter, the transport robot TR3 places the substrate W onto the substrate rest part PASS6. The transport robot TR2 in the resist coating cell places the substrate W from the substrate rest part PASS6 onto the substrate rest part PASS4 without any processing of the substrate W. Next, the transport robot TR1 in the BARC cell places the substrate W from the substrate rest part PASS4 onto the substrate rest part PASS2 without any processing of the substrate W, whereby the substrate W is stored in the indexer block 1. Then, the substrate transfer mechanism 12 in the indexer cell stores the processed substrate W held on the substrate rest part PASS2 into a predetermined cassette C. Thereafter, the cassette C in which a predetermined number of processed substrates W are stored is transported to the outside of the substrate processing apparatus. Thus, a series of photolithography processes are completed.

In the substrate processing apparatus according to this preferred embodiment, the chemically amplified resist is applied as the photoresist to the substrate W. When the chemically amplified resist is used, a slight variation in processing conditions exerts a large influence upon line width uniformity, as described above. For this reason, processing conditions are made as constant as possible for all of the substrates W to be processed. In particular, the substrate processing apparatus according to this preferred embodiment is managed so as to provide a constant time interval between the instant of the completion of the exposure process in the exposure unit EXP and the instant of the start of the post-exposure bake process in the heating parts PHP7 to PHP12, because this time interval exerts the greatest influence on the line width uniformity.

Additionally, the substrate processing apparatus according to this preferred embodiment is adapted to provide a constant time interval between the instant of the completion of the cleaning process of substrates W in the cleaning processing unit SOAK1 and the instant of the start of the post-exposure bake process of the substrates W in the heating parts PHP7 to PHP12. This preferred embodiment adopts a technique to be described below to provide the constant time interval between the instant of the completion of the exposure process in the exposure unit EXP and the instant of the start of the post-exposure bake process in the heating parts PHP7 to PHP12 and to provide the constant time interval between the instant of the completion of the cleaning process in the cleaning processing unit SOAK1 and the instant of the start of the post-exposure bake process in the heating parts PHP7 to PHP12.

Figure 10:
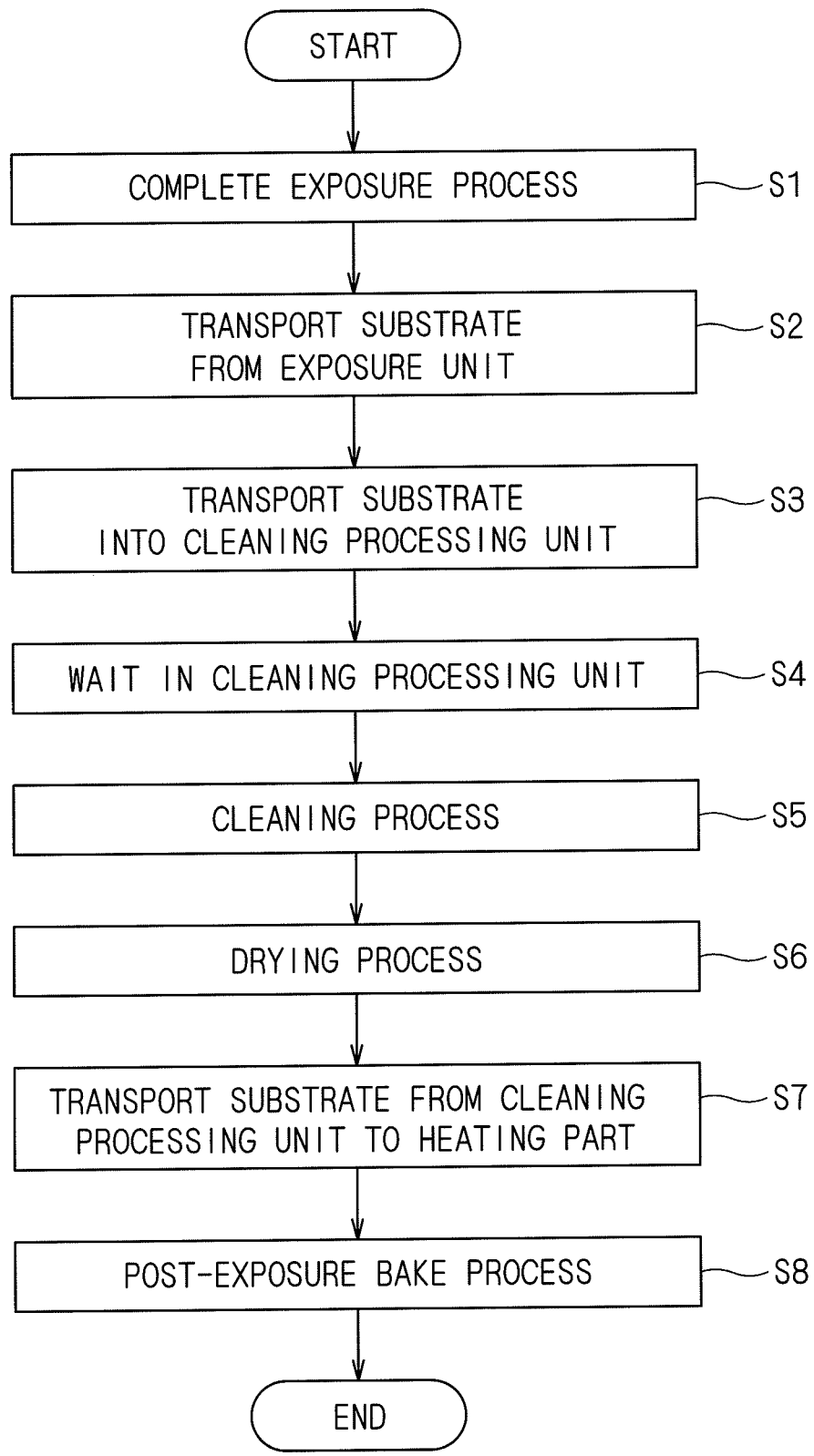
FIG. 10 is a flow chart showing a processing procedure from the end of exposure in an exposure unit to the start of a post-exposure bake process in a heating part.

FIG. 10 is a flow chart showing a processing procedure from the end of the exposure in the exposure unit EXP to the start of the post-exposure bake process in the heating parts PHP7 to PHP12. FIG. 11 is a timing chart for processing from the end of the exposure to the post-exposure bake process. First, the exposure process of a substrate W in the exposure unit EXP is completed at time t1 (in Step S1). At this point, the exposure unit EXP sends an exposure completion signal, and the substrate processing apparatus receives the exposure completion signal through the host computer 100. As a result, the main controller MC of the substrate processing apparatus recognizes the completion of the exposure process of the substrate W in the exposure unit EXP at the time t1 to store the time t1 as an exposure completion time in a storage portion thereof.

Subsequently, the substrate W subjected to the exposure process is returned from the exposure unit EXP to the interface cell (in Step S2), and is transported into the cleaning processing unit SOAK1 by the transport mechanism 55 (in Step S3). The procedure of the processes in Step S3 and its subsequent steps is executed by the cell controllers CC for the interface cell and the post-exposure bake cell controlling the mechanical parts in accordance with an instruction from the main controller MC. A basic flow of the cleaning and drying processes of a substrate W in the cleaning processing unit SOAK1 is as discussed above.

In a pattern labeled (a) in FIG. 11, it takes a relatively long time to transport a substrate W from the exposure unit EXP to the cleaning processing unit SOAK1, and the substrate W subjected to the exposure process is transported into the cleaning processing unit SOAK1 at time t3. The relatively long time required for the substrate W subjected to the exposure process to be transported into the cleaning processing unit SOAK1 can result from a factor such that the transport mechanism 55 is performing a wafer feed operation (or the operation of transferring an unexposed substrate W to the exposure unit EXP) at the time of the transfer of the substrate W subjected to the exposure process from the exposure unit EXP to the transport mechanism 55.

After the substrate W is transported into the cleaning processing unit SOAK1 at the time t3, the substrate W waits until time t4 in the cleaning processing unit SOAK1 (in Step S4). Specifically, the substrate W waits while being held by the spin chuck 421 under suction without the application of the cleaning liquid thereto from the cleaning processing nozzle 450. At the time t4, the application of the cleaning liquid from the cleaning processing nozzle 450 starts while the substrate W is rotated. Thus, the cleaning process of the substrate W is executed (in Step S5). Next, the application of the inert gas to near the center of the upper surface of the substrate W from the drying processing nozzle 451 starts at time t5. The cleaning process of the substrate W in the cleaning processing unit SOAK1 is completed at the time t5. After the time t5, the drying process of the substrate W is executed (in Step S6). Thereafter, the supply of the inert gas from the drying processing nozzle 451 is stopped at time t6, and the drying process of the substrate W is completed. Thereafter, the substrate W transported out of the cleaning processing unit SOAK1 by the transport mechanism 55 is transported into one of the heating parts PHP7 to PHP12 by the transport mechanism 55 and the transport robot TR4 (in Step S7). The post-exposure bake process of the substrate W in the one of the heating parts PHP7 to PHP12 (in Step S8) starts at time t7.

In a pattern labeled (b) in FIG. 11, it takes a relatively short time to transport a substrate W from the exposure unit EXP to the cleaning processing unit SOAK1, and the substrate W subjected to the exposure process is transported into the cleaning processing unit SOAK1 at time t2. If the transport mechanism 55 is able to receive the exposed substrate W immediately after the substrate W is fed out of the exposure unit EXP, the substrate W is transported to the cleaning processing unit SOAK1 for such a short time.

After the substrate W is transported into the cleaning processing unit SOAK1 at the time t2, the substrate W waits until the time t4 in the cleaning processing unit SOAK1. Subsequently, the application of the cleaning liquid from the cleaning processing nozzle 450 starts while the substrate W is rotated at the time t4, and the application of the inert gas to near the center of the upper surface of the substrate W from the drying processing nozzle 451 starts at the time t5, in a manner similar to that in the above-mentioned pattern labeled (a). The supply of the inert gas from the drying processing nozzle 451 is stopped at the time t6. The substrate W is transported from the cleaning processing unit SOAK1 to one of the heating parts PHP7 to PHP12. The post-exposure bake process of the substrate W starts at the time t7.

As discussed above, the substrate processing apparatus and the exposure unit EXP have the individual control mechanisms, respectively, and the operations thereof are not completely synchronized. Thus, there are cases where the transport mechanism 55 is unable to receive a substrate W subjected to the exposure process at the time of the feed of the substrate W from the exposure unit EXP, and variations sometimes arise in a transport time interval between the completion of the exposure process and the transport of the substrate W into the cleaning processing unit SOAK1 (See (a) and (b) in FIG. 11). If the subsequent cleaning and drying processes are executed and the post-exposure bake process is started in the presence of such variations, uneven time intervals occur between the instant of the completion of the exposure process and the instant of the start of the post-exposure bake process. Even if an adjustment is made to the time at which the post-exposure bake process starts to provide a constant time interval between the instant of the completion of the exposure process and the instant of the start of the post-exposure bake process, uneven time intervals result between the instant of the completion of the cleaning process in the cleaning processing unit SOAK1 and the instant of the start of the post-exposure bake process.

Thus, the main controller MC adjusts the waiting time of the exposed substrate W transported into the cleaning processing unit SOAK1 so as to provide a constant time interval between the exposure process completion time t1 and the time t5 at which the cleaning process is completed, thereby to provide the constant time interval between the instant (the time t1) of the completion of the exposure process in the exposure unit EXP and the instant (the time t7) of the start of the post-exposure bake process in the heating parts PHP7 to PHP12 and to provide the constant time interval between the instant (the time t5) of the completion of the cleaning process in the cleaning processing unit SOAK1 and the instant (the time t7) of the start of the post-exposure bake process in the heating parts PHP7 to PHP12. The cleaning and drying processes in the cleaning processing unit SOAK1 and the subsequent substrate transport are executed in accordance with a previously set predetermined sequence, and are each carried out for a constant time period. Therefore, the adjustment made to the waiting time of the exposed substrate W in the cleaning processing unit SOAK1 to provide a constant time interval between the exposure process completion time t1 and the cleaning process start time t4 achieves the constant time interval between the exposure process completion time and the post-exposure bake process start time and the constant time interval between the cleaning process completion time and the post-exposure bake process start time.

In place of the adjustment made to the waiting time of the exposed substrate W in the cleaning processing unit SOAK1, an adjustment may be made to the cleaning processing time to provide the constant time interval between the exposure process completion time t1 and the cleaning process completion time t5. In a pattern labeled (c) in FIG. 11, it takes a relatively short time to transport a substrate W from the exposure unit EXP to the cleaning processing unit SOAK1, and the substrate W subjected to the exposure process is transported into the cleaning processing unit SOAK1 at the time t2 in a manner similar to that in the pattern labeled (b). Subsequently, the application of the cleaning liquid from the cleaning processing nozzle 450 starts while the substrate W is rotated at the time t2 without any particular waiting step, and the application of the inert gas to near the center of the upper surface of the substrate W from the drying processing nozzle 451 starts at the time t5. Thereafter, in a manner similar to those in the patterns labeled (a) and (b), the supply of the inert gas from the drying processing nozzle 451 is stopped at the time t6, and the substrate W is transported from the cleaning processing unit SOAK1 to one of the heating parts PHP7 to PHP12. Also, the post-exposure bake process of the substrate W starts at the time t7.

In this manner, the main controller MC may adjust the cleaning time of the exposed substrate W transported into the cleaning processing unit SOAK1 so as to provide the constant time interval between the exposure process completion time t1 and the cleaning process completion time t5. This also provides the constant time interval between the instant (the time t1) of the completion of the exposure process in the exposure unit EXP and the instant (the time t7) of the start of the post-exposure bake process in the heating parts PHP7 to PHP12, and provides the constant time interval between the instant (the time t5) of the completion of the cleaning process in the cleaning processing unit SOAK1 and the instant (the time t7) of the start of the post-exposure bake process in the heating parts PHP7 to PHP12.

A summary of the details of the patterns labeled (a) to (c) in FIG. 11 is as follows. The cell controller CC of the interface cell controls the mechanical parts in accordance with an instruction from the main controller MC to adjust the length of time (referred to hereinafter as a "presence time") that the exposed substrate W is present in the cleaning processing unit SOAK1, thereby adjusting the instant of the end of the cleaning process so as to provide the constant time interval between the instant of the completion of the exposure process and the instant of the end of the cleaning process. This provides the constant time interval between the instant of the completion of the exposure process and the instant of the start of the post-exposure bake process, and provides the constant time interval between the instant of the completion of the cleaning process and the instant of the start of the post-exposure bake process. The constant time interval between the instant of the completion of the exposure process and the instant of the start of the post-exposure bake process and the constant time interval between the instant of the completion of the cleaning process and the instant of the start of the post-exposure bake process achieve further improvements in the line width uniformity of a pattern formed when the chemically amplified resist is used. The adjustment made to the presence time of the exposed substrate W in the cleaning processing unit SOAK1 avoids the influence of heat upon the exposed substrate W more reliably than the adjustment made to the waiting time of the substrate W in the heating parts PHP7 to PHP12. In the pattern labeled (c) in FIG. 11, the exposed substrate W is in contact with the water for a relatively long time. However, whether this cleaning time is long or short is considered to have little effect on the line width uniformity of a pattern.

While the preferred embodiment according to the present invention is described hereinabove, the present invention is not limited to the above-mentioned specific embodiment. For example, the above-mentioned preferred embodiment is based on the premise that each of the cleaning and drying processes in the cleaning processing unit SOAK1 and the subsequent substrate transport requires an approximately constant time. If variations arise in the time required for these processes, a modification may be made to cause the substrate W to further wait in the heating parts PHP7 to PHP12, thereby providing the constant time interval between the instant of the completion of the exposure process and the instant of the start of the post-exposure bake process and the constant time interval between the instant of the completion of the cleaning process and the instant of the start of the post-exposure bake process. For example, if variations arise in the time required for the substrate transport from the cleaning processing unit SOAK1 to the heating parts PHP7 to PHP12, such a modification is made to cause the substrate W to wait in the temporary substrate rest part 719 of the heating parts PHP7 to PHP12, thereby adjusting the time interval between the instant of the completion of the cleaning process and the instant of the start of the post-exposure bake process to be constant. In other words, when the instant of the end of the cleaning process is adjusted so that the time interval between the instant of the completion of the exposure process and the instant of the end of the cleaning process is constant, subsequently adjusting the time interval between the instant of the completion of the cleaning process and the instant of the start of the post-exposure bake process in the heating parts PHP7 to PHP12 to be constant leads to adjusting the time interval between the instant of the completion of the exposure process and the instant of the start of the post-exposure bake process to be constant.

The drying process as a step subsequent to the cleaning process in the cleaning processing unit SOAK1 is not essential.

The construction of the substrate processing apparatus according to the present invention is not limited to the configuration shown in FIGS. 1 to 4. However, various modifications may be made to the construction of the substrate processing apparatus if a transport robot circulatingly transports a substrate W to a plurality of processing parts whereby predetermined processes are performed on the substrate W.

While the invention has been described in detail, the foregoing description is in all aspects illustrative and not restrictive. It is understood that numerous other modifications and variations can be devised without departing from the scope of the invention.

What is claimed is:

1. A method of processing a plurality of substrates subjected to an exposure process of photolithography, said method comprising the steps of:
    performing an exposure process to a substrate in the plurality of substrates with a resist film formed thereon by a resist coating process;
    transporting the substrate subjected to the exposure process to a cleaning processing part, wherein transporting the substrate is performed during a transport time;
    performing a cleaning process in said cleaning processing part on said substrate subjected to the exposure process, wherein performing the cleaning process is performed during a cleaning time and at least one of the transport time or the cleaning time differs substrate-to-substrate;
    transporting said substrate subjected to the cleaning process from said cleaning processing part to a heating processing part;
    performing a heating process in said heating processing part on said substrate subjected to the cleaning process; and
    performing a development process on said substrate subjected to the heating process,
    wherein a first interprocess time interval between the instant at which the exposure process of a substrate is completed and the instant at which the heating process of the substrate is started is a first predetermined constant value substrate-to-substrate, and a second interprocess time interval between the instant at which the cleaning process of the substrate is completed and the instant at which the heating process of the substrate is started is a second predetermined constant value substrate-to-substrate.

2. The method according to claim 1, wherein
said first interprocess time interval and said second interprocess time interval are made constant by adjusting the instant at which said cleaning processing part completes the cleaning process.

3. The method according to claim 2, wherein
said instant at which said cleaning processing part completes the cleaning process is adjusted by adjusting a presence time for which the substrate subjected to the exposure process is present in said cleaning processing part.

4. The method according to claim 3, wherein
said presence time is adjusted by adjusting a waiting time for which the substrate subjected to the exposure process and transported to said cleaning processing part waits until said cleaning process.

5. The method according to claim 3, wherein
said presence time is adjusted by adjusting a cleaning processing time for which the substrate subjected to the exposure process is subjected to the cleaning process by said cleaning processing part.

6. The method according to claim 1, wherein
said exposure process is an immersion exposure process.

* * * * *